(12) United States Patent
Gregerson et al.

(10) Patent No.: US 8,919,563 B2
(45) Date of Patent: Dec. 30, 2014

(54) METHODS AND APPARATUS FOR LARGE DIAMETER WAFER HANDLING

(71) Applicant: Entegris, Inc., Billerica, MA (US)

(72) Inventors: Barry Gregerson, Deephaven, MN (US); Michael Shawn Adams, New Prague, MN (US); Jason Todd Steffens, Shakopee, MN (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 13/847,345

(22) Filed: Mar. 19, 2013

(65) Prior Publication Data

US 2013/0287528 A1    Oct. 31, 2013

Related U.S. Application Data

(63) Continuation of application No. 12/812,729, filed as application No. PCT/US2009/030870 on Jan. 13, 2009, now abandoned.

(60) Provisional application No. 61/020,736, filed on Jan. 13, 2008, provisional application No. 61/134,604, filed on Jul. 11, 2008.

(51) Int. Cl.
*H01L 21/673*    (2006.01)
*H01L 21/677*    (2006.01)

(52) U.S. Cl.
CPC ...... *H01L 21/6732* (2013.01); *H01L 21/67383* (2013.01); *H01L 21/67763* (2013.01); *H01L 21/67386* (2013.01); *H01L 21/67369* (2013.01)
USPC .......................................... 206/711; 206/710

(58) Field of Classification Search
CPC .............. H01L 21/673; H01L 21/6732; H01L 21/6735; H01L 21/67383; H01L 21/67369; H01L 21/67386; B65D 85/48; B65D 85/30
USPC .......................... 206/711, 710, 832, 833, 454
See application file for complete search history.

(56) References Cited

U.S. PATENT DOCUMENTS

| | | | |
|---|---|---|---|
| 5,988,392 | A | 11/1999 | Hosoi |
| 6,186,331 | B1 | 2/2001 | Kinpara et al. |
| 6,206,196 | B1 | 3/2001 | Krampotich et al. |
| 6,446,806 | B1 | 9/2002 | Ohori et al. |
| 6,581,264 | B2 | 6/2003 | Ohori et al. |
| 6,736,268 | B2 * | 5/2004 | Nyseth et al. .................. 206/711 |
| 6,776,289 | B1 * | 8/2004 | Nyseth .......................... 206/711 |
| 6,874,638 | B2 * | 4/2005 | Iijima et al. ................... 206/711 |

(Continued)

FOREIGN PATENT DOCUMENTS

| | | |
|---|---|---|
| CN | 1906098 A | 1/2007 |
| EP | 1 583 134 A2 | 10/2005 |

(Continued)

*Primary Examiner* — Steven A. Reynolds
(74) *Attorney, Agent, or Firm* — Christensen Fonder P.A.

(57) ABSTRACT

A front semiconductor opening wafer container for large diameter wafers includes a container portion and a door. The container portion includes a left closed side, a right closed side, a closed back, an open front, and an open interior including a plurality of slots for receiving and containing the wafers. The door is attachable to the container portion to close the open front and selectively latchable to the container portion. The container portion can accommodate large diameter wafers, particularly 450 mm wafers. Optimized sag control is provided as well as enhanced structural rigidity, and wafer seating features.

9 Claims, 14 Drawing Sheets

(56) References Cited

U.S. PATENT DOCUMENTS

| | | |
|---|---|---|
| 6,902,063 B2 | 6/2005 | Pai et al. |
| 6,945,405 B1 | 9/2005 | Bores et al. |
| 6,951,340 B2 | 10/2005 | Suzuki et al. |
| 7,100,772 B2 * | 9/2006 | Burns et al. .................. 206/710 |
| 7,108,135 B2 | 9/2006 | Park |
| 7,325,693 B2 | 2/2008 | Burns et al. |
| 7,344,031 B2 * | 3/2008 | Hasegawa et al. ............ 206/710 |
| 7,823,730 B2 * | 11/2010 | Mimura et al. ................ 206/710 |
| 8,464,872 B2 * | 6/2013 | Inoue ............................. 206/711 |
| 8,505,732 B2 * | 8/2013 | Lu et al. ........................ 206/711 |
| 2002/0005369 A1 | 1/2002 | Nyseth et al. |
| 2003/0106831 A1 | 6/2003 | Eggum |
| 2003/0141217 A1 | 7/2003 | Park |
| 2004/0041355 A1 | 3/2004 | Suzuki et al. |
| 2004/0069728 A1 | 4/2004 | Huang et al. |
| 2005/0109668 A1 * | 5/2005 | Burns et al. .................. 206/711 |
| 2005/0109669 A1 * | 5/2005 | Burns et al. .................. 206/711 |
| 2005/0115867 A1 | 6/2005 | Burns et al. |
| 2005/0173296 A1 | 8/2005 | Hyobu et al. |
| 2005/0247594 A1 * | 11/2005 | Mimura et al. ................ 206/710 |
| 2006/0027477 A1 | 2/2006 | Matsutori et al. |
| 2006/0207916 A1 * | 9/2006 | Mimura et al. ................ 206/710 |
| 2006/0243620 A1 | 11/2006 | Odashima et al. |
| 2006/0283771 A1 | 12/2006 | Park |
| 2006/0283774 A1 * | 12/2006 | Hasegawa et al. ............ 206/725 |
| 2006/0289333 A1 * | 12/2006 | Burns et al. .................. 206/711 |
| 2007/0151897 A1 * | 7/2007 | Nakayama et al. ............ 206/711 |
| 2007/0187287 A1 | 8/2007 | Toda et al. |
| 2007/0295638 A1 | 12/2007 | Nakatogawa |
| 2008/0041761 A1 | 2/2008 | Nakatogawa |
| 2009/0194456 A1 * | 8/2009 | Fuller et al. .................. 206/711 |
| 2011/0100870 A1 * | 5/2011 | Ohnuki et al. ................ 206/710 |
| 2013/0056388 A1 * | 3/2013 | Nagashima ................... 206/711 |

FOREIGN PATENT DOCUMENTS

| | | |
|---|---|---|
| EP | 1 605 496 A2 | 12/2005 |
| JP | 11-016997 | 1/1999 |
| JP | 2001-301878 A | 10/2001 |
| JP | 2003-118776 A | 4/2003 |
| JP | 2003-303879 | 10/2003 |
| JP | 2004-134737 A | 4/2004 |
| JP | 2005-500954 A | 1/2005 |
| JP | 2005-191021 | 7/2005 |
| JP | 2006-120791 | 5/2006 |
| JP | 2006-216775 | 8/2006 |
| JP | 2007-123685 | 5/2007 |
| KR | 10-2006-0119816 A | 11/2006 |
| WO | WO 03/018434 A1 | 3/2003 |
| WO | WO 03018434 | 3/2003 |

* cited by examiner

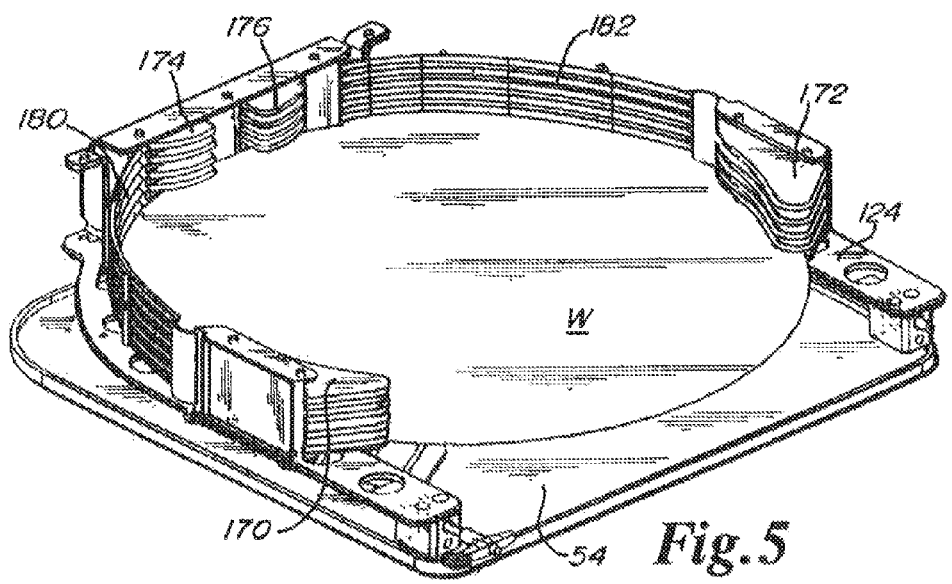
Fig.5
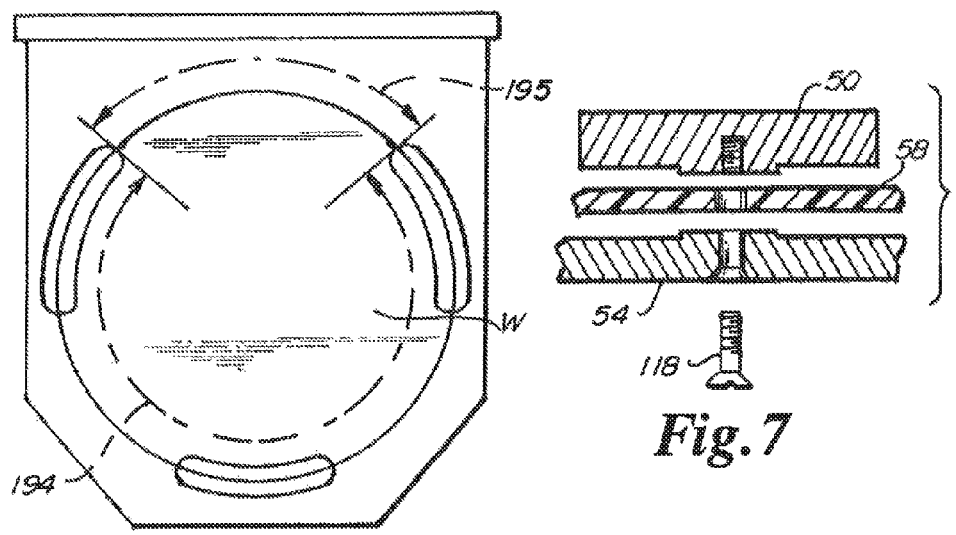
Fig.6
Fig.7

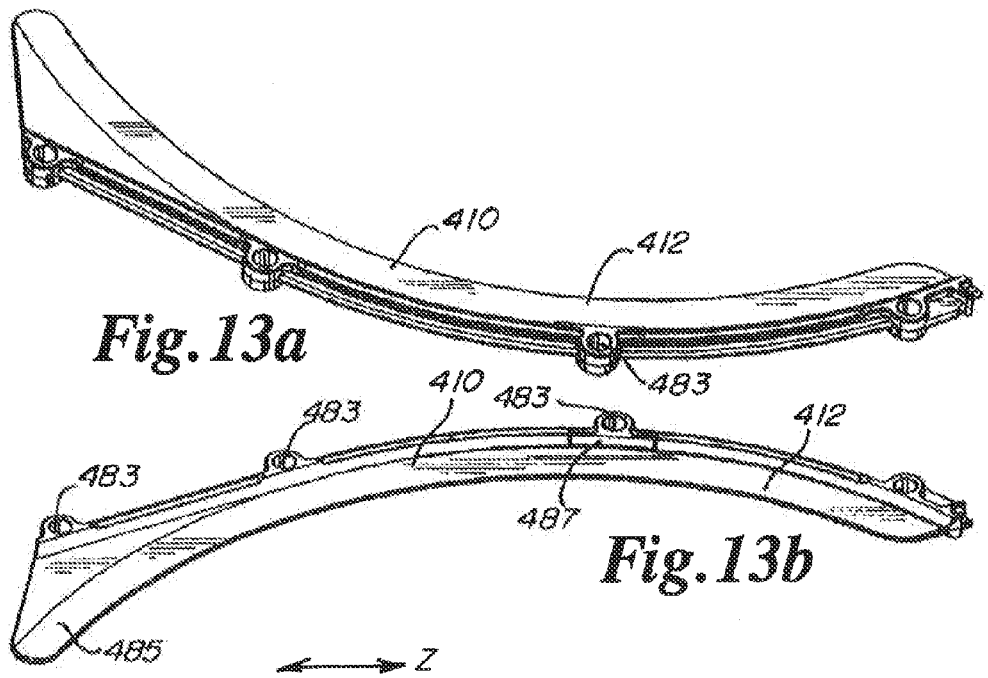
*Fig.13a*
*Fig.13b*
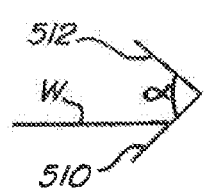
*Fig.14*
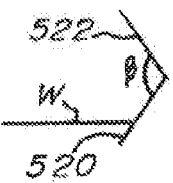
*Fig.15*
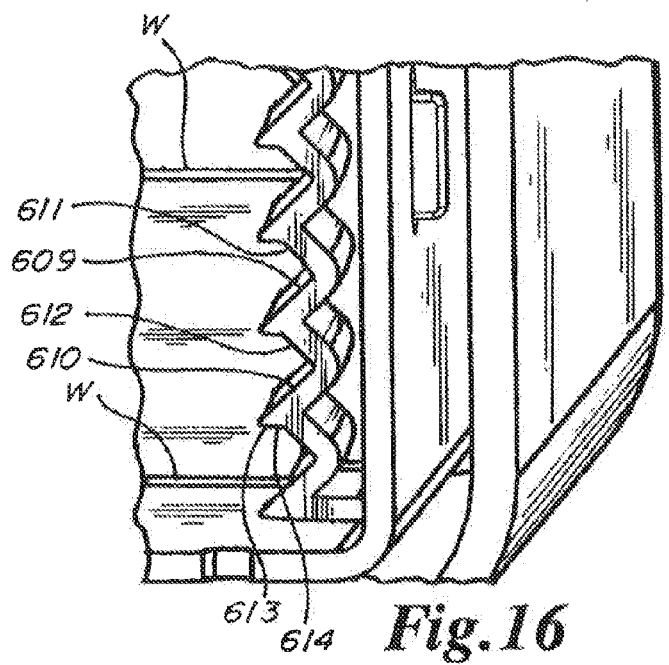
*Fig.16*

METHODS AND APPARATUS FOR LARGE DIAMETER WAFER HANDLING

RELATED APPLICATIONS

This is a Continuation Application that claims priority to U.S. application Ser. No. 12/812,729 filed Sep. 29, 2010 which was a National Stage Application of PCT/US2009/030870, filed Jan. 13, 2009, and which claim priority to U.S. Provisional Application Nos. 61/020,736, filed Jan. 13, 2008, and 61/134,604, filed Jul. 11, 2008, all of the above applications are fully incorporated herein by reference.

FIELD OF THE INVENTION

This invention relates to semiconductor processing equipment. More specifically it relates to carriers for transporting and storing semiconductor wafers.

BACKGROUND OF THE INVENTION

As the number of circuits per unit area has increased, particulates have become more of an issue for semiconductor wafers. The size of particulates that can destroy a circuit has decreased and is approaching the molecular level. Particulate control is necessary during all phases of manufacturing, processing, transporting, and storage of semiconductor wafers. Particle generation during insertion and removal of wafers into carriers and from movement of wafers in carriers during transport needs to be minimized or avoided.

Driven by economies of scale, the size of wafers utilized in semiconductor fabrication facilities (fabs) has continually increased. Currently there are a number of fabs that process 300 mm wafers. It is anticipated that soon the maximum size of commercially processed wafers will increase to 450 mm. With the significant leaps in the size of processed wafers, new issues and problems arise that were not present with smaller sized wafers.

For example, although wafer containers are often robotically handled such as by gripping robotic flanges on the top of the containers, they are still manually handled in many instances and typically come equipped with or have optional side handles. It is still relatively easy for personnel, by using such handles, to manually transport standardized 300 mm containers loaded with wafers as such containers often around weigh 20 pounds.

Standards for 450 mm wafers, such as the number of wafers in containers and the spacing between wafers, may very well remain the same as current 300 mm wafer container standards due to existing equipment compatibilities and cost pressures. And, of course, as wafers get larger in diameter, they correspondingly get heavier. A wafer container that holds the same number of 450 mm wafers as is provided in standardized 300 mm containers is expected to weigh approximately 40 pounds. At this weight, manual handling starts to become more difficult.

Using comparable thicknesses of polymer walls for a larger container may not provide sufficient structural rigidity of the container. That is, the container would be expected to be less dimensionally stable under loading, transfer and shipping due to the greater dimensions and greater expanses of polymer. Thickening the walls and adding significant strengthening structure would further increase the weight of 450 mm wafer containers.

Moreover, conventional 300 mm wafer containers are typically injection molded. It is anticipated that it will be difficult to adequately control the dimensions of larger containers utilizing comparable injection molding practices and comparable or larger wall thicknesses. Currently 300 mm wafer containers generally utilize the shell as the principal structural member for positioning components that interface with wafers and outside equipment, namely the wafer supports and the kinematic coupling machine interface.

In addition, the open interior volume will significantly increase as will the area of the open front that sealingly receives the door. This suggests more difficult sealing issues between the door and the container portion.

Wafers of larger dimensions will also have significantly greater sag which will make them more susceptible to damage during handling and transport and require unique support not required for smaller wafers. This greater sag presents challenges in maintaining the desired spacing between wafers while still allowing placement and removal of the wafers robotically by robotic arms and that are known as end effectors. Such devices are inserted between wafers in the front opening containers generally underneath a wafer to be grasped and removed. It is critical that there is no contact with the end effector with either adjacent wafer or the wafer container during insertion of the end effector to grasp the wafer. Once the wafer is grasped, removal must be accomplished without scraping or any contact by the end effector or wafer being removed with the adjacent wafers or container. Increased sagging of 450 mm wafers compared to 300 mm wafers make such retrieval and placement operations substantially more difficult in the 450 containers compared to 300 mm containers. Similarly, during placement of a wafer in a wafer container, no contact with adjacent wafers or the container is permissible. Current industry standards discussions and proposed standards by SEMI (Semiconductors Equipment and Materials International, a trade association) have tentatively allowed 68 degrees at the center rear of the wafer that is available for grasping (with at the very center rear for a wafer cushion feature) the 450 mm wafers. Such discussions and proposed standards also provide 72 degrees at the front center of the wafer for grasping or engagement by an end effector. Conventional front opening wafer containers provide front center, at least about 120 degrees of an access opening which may provide excessive front sag of the wafers making end effector insertion and engagement problematic.

Thus, it would be desirable to develop front opening configurations for 450 mm wafer containers that have design attributes for minimizing wafer sag and minimizing weight of the container. In addition, configurations providing improved sealing characteristics for the doors would be desirable. Moreover, configurations providing enhanced wafer support to accommodate storing of 450 mm wafers in wafer containers as well during robotic handling of the wafers would be desirable. Providing a container that minimizes the damage that could be caused to wafers by warpage or shrinkage of the shell components would also be desirable.

SUMMARY OF THE INVENTION

A wafer container or microenvironment for transporting or holding wafers in a horizontal axially aligned arrangement can have a container portion with an open front and a closeable door. The container is particularly amenable for transport of wafers greater than 300 mm, for example 450 mm wafers, but aspects herein may be suitable for incorporation into 300 mm wafer containers and containers for other sizes of wafers and other substrates.

This invention, aspects of the invention, and the embodiments described herein are applicable to and include wafer containers intended to be utilized exclusively in fabs where the wafers therein are always nearly horizontal (known as FOUPS in the context of 300 mm wafer containers) as well as wafer containers that are loaded and unloaded with the wafers in a horizontal orientation and where the containers are then rotated 90 degrees such that the wafers are vertical, for shipping or transport. Such wafer containers utilized for shipping wafers among different facilities are generally known as FOSBS (Front Opening Shipping Boxes) in the context of 300 mm wafer containers.

In one embodiment, the container portion comprises a framework and shell portion. The framework comprises functional interface components including a rigid kinematic coupling plate, rigid wafer supports, and a rigid door frame interconnected together. The shell, which may comprise one or more pieces, is attached thereto. In particular embodiments, portions of the framework may be a metal, for example aluminum that provides enhanced structural rigidity over conventional polymers. Additionally, high strength polymers may be utilized for the framework portions such as polyetheretherketone (PEEK), or composite pieces may be utilized comprising metals and polymers or different polymers.

The shell is preferably formed of a transparent polymer permitting viewing of the wafers therein. The shell may be formed of conventional polycarbonate, or other polymers and may be conventionally injection molded. In certain embodiments highly suitable for the larger containers for 450 mm wafers, the shell may be vacuum formed. Moreover, with vacuum forming, multiple layers of compatible polymers may be utilized. The shell may be formed of separate pieces, such as two clam shell pieces assembled together, or may be formed of a single vacuum molded component.

In particular embodiments, the shell is independent of critical dimensional, structural, and/or functional interface requirements. For example, in particular embodiments, the shell is not relied upon for positioning interface features such as the kinematic coupling, the door frame, and the wafer supports. Rather, these features or components are connected to one another and the shell is attached to the interconnected functional componentry. The shell may be attached at the door frame and the bottom of the container at the kinematic coupling plate, but either not be connected to the wafer supports or only connected to the wafer supports at the bottom of the container. This provides independence of the functional interface features from molding variations while not affecting the performance or relative placement of the critical components, particularly the functional interface features of the wafer container.

In particular embodiments of the invention, the shell includes an integral horizontal projection that projects outwardly with respect to the exterior. The projection can be configured as a band extending around the shell on three sides, for example, the left side, the right side, and the back side. The projection may also define a recess in the interior of the shell. The projection may be formed by a portion of the wall projecting outwardly with the wall thickness remaining nominally the same. The band may be continuous on all three sides or may be positioned on the left side and right side and not extend around or entirely around the back side. The band provides an integral handling feature that provides substantial structural strength enhancement to the shell with minimal weight expense. Where the shell is formed from vacuum molding, the interface between two clam shell pieces may suitably be at the outwardly projecting band.

In particular embodiments, the wafers are supported by wafer supports that are part of the framework. The wafer supports may be attached to the shell at the bottom of the container but not thereabove, or may not be attached to the shell at all, instead attaching only to the internal framework of the container.

The door comprises a latch mechanism which is conventionally key operated and seals to the door frame. In particular embodiments, the interface between the door and the container portion, at the door frame, provides a interlaced connection. The door frame has a slot or groove inwardly directed and the door has a projection that enters the slot whereby said projection is constrained within the slot. The door frame has an upper horizontal portion and a lower horizontal portion where the slot or slots extend horizontally and the corresponding projection or projections on the door also extend horizontally and, when engaged in said slot, the door by way of the projection is constrained upwardly and downwardly. Similarly, the door frame may have a left vertical portion and a right vertical portion where the slot or slots extend vertically and the corresponding projection or projections on the door also extend vertically and, when engaged in said slot or slots, the door by way of the projection or projections is constrained to the left and to the right. The slot may be continuous or not continuous around the door frame and similarly the door may have a single cooperating projection extending around the entire periphery of the door or more than one projection at selected portions of the periphery of the door. In particular embodiments, the slot or groove will have an elastomeric seal seated therein. In other embodiments, a seal may be positioned out of the slot or groove or on the door. Generally the seal will extend around the entirety of the door frame defining the door opening and engage with the entirety of the door periphery. The seal may also extend around the entirety of the door periphery and engage with the entirety of the door frame defining the door opening.

The door frame may be formed of a plurality of components. Particularly, the door frame may be configured as two layers or components that sandwich the shell therebetween. This is a particularly suitable configuration for vacuum molded shell portions. Seal material may be utilized at such a junction to facilitate complete sealing of the microenvironment. The door frame can be formed of rigid materials, such as aluminum or the like, rigid polymers or a composite configuration.

In an embodiment of the invention, rigid frame members can support the polymer wafer shelves and connect the wafer shelves to a rigid kinematic coupling plate.

In an embodiment of the invention the shell portion is comprised of one or more vacuum molded shell pieces assembled with the kinematic coupling plate and internal framework.

A feature and advantage is that the weight of the container portion may be minimized by utilizing thinner shell portions than in conventional wafer containers.

In a certain embodiment, the shell provides primarily a containment function while relying on internal framework for rigidly securing the wafer supports with respect to the kinematic coupling and the front door frame on the bottom of the carrier. A feature and advantage is that deflection, movement, or expansion of the shell does not directly move or involve the wafers and the wafer seating positions are isolated from the portions of the shell that are deflectable, movable, or expandable. A further advantage and feature of the invention is that the composite construction and isolation of the shell from the functional interface portions minimizes the negative effects associated with molding large carriers such as warpage and shrinkage.

In particular embodiments, a manual handle can be provided that is not a separate component from the shell. A feature and advantage of such a configuration is that the manual handle provides enhanced structural strength of the shell compared to a featureless shell wall. The manual handle may be comprised of two substantially horizontal wall portions, a top wall portion and a bottom wall portion, and a vertical wall portion connecting and integral to the substantially horizontal wall portions. The horizontal wall portions can be vertically separated by a distance sized to allow simultaneous hand gripping of the top and bottom horizontal wall portions, with a user's left hand grasping the manual handle at the left side of the container and the user's right hand grasping the manual handle at the right side of the container.

Further aspects of the invention particularly suitable for 300 mm wafers and larger include enhanced wafer support features. In particular embodiments, one or more stacks of thin (in the vertical direction) cantilevered projections extend from the back of the cassette forwardly toward the open front (or door) of the container to provide underside wafer support in positions spaced from the peripheral edge of the wafers to prevent or reduce sagging. The cantilever supports define a plurality of slots vertically stacked for receiving, supporting, and discharging wafers. In certain embodiments, the positioning of the forwardly extending cantilever support extends in at least 50 mm from the edge, in other embodiments at least 75 mm from the peripheral edge of the wafers, and in other embodiments at least 100 mm inside the peripheral edge, in other embodiments, at least 125 mm inside the peripheral edge. In certain embodiments, each slot has a first seating position where the wafers rest on the cantilever projections and a second seating position elevated above the cantilever projections.

In particular embodiments, a wafer container can include one or more vertical stacks of generally rigid rearwardly positioned wafer restraints with horizontal V-shaped grooves. The surfaces defining the V-shaped grooves provide an upward lift to the wafers when they are urged backward into the slot, such as by insertion of the door into engagement with the door frame whereby the front exposed edges of the wafers are engaged by a wafer restraint on the door. The front wafer restraint may have a V-shaped groove that further urges the wafer to elevate as the wafer edge rides up the lower inclined leg of the horizontal V (open horizontally) during engagement of the door with the door frame. The second seating position is defined by the internal apex of the V-shaped grooves and is positioned above the first seating position.

In some embodiments, the angle of the V of the V-shaped engagement portions can vary depending on the positional placement of the V-shaped portions around the periphery of the wafer. Raising the wafer from a shelf seating position to the second position where the door is in place and latched occurs by the wafers moving in the z direction with respect to the V-shaped seating portions. Considering the larger 450 mm wafers, it is advantageous to have several V-shaped seating portions that the wafer can ride up to reach the apex of the Vs, the seating position. Where the V-shaped seating portion is directly facing the insertion direction of the wafer, the z direction, the lower leg incline can have a gradual slope and the angle between the upper leg (downwardly facing) surface and the lower leg (upwardly facing surface) is at a minimum. Where V-shaped seating positions engage the wafer at a position where the seating portion is facing more towards the x axis, that is, more towards the sides of the container than the back of the container, the slope of the lower leg will be less and the angle defined by the lower leg and the upper leg will be greater. The component of movement perpendicular to the V-shaped wafer portion is much less towards the sides of the wafer container than at the back of the wafer container, thus the greater angle V on the wafer engagement portions towards the sides compared to the back side allows continual support at different peripheral locations on the wafer edge as the wafer is being elevated by the insertion of the door. This minimizes sag in the wafer. The V-shaped engagement portions may be isolated discrete portions extending a few millimeters horizontally to engage the wafer, 5 to 20 mm in length or can be much longer or even continuous on the backside of each slot. In certain embodiments the lower leg of the engagement portions can have a curvature and similarly the curvature of the lower legs of the wafer engagement portions positioned nearer the sides will be steeper than the curvature of engagement portion nearer the back side. Note the utilization of V-shaped engagement portions in elevating the wafer as the door is closed is disclosed in U.S. Pat. No. 6,267,245, which is incorporated by reference herein, In particular embodiments, the lower leg of the V-shaped groove may be longer than the upper leg. This provides a larger engagement region for larger wafers that may be sagging. This V-shaped groove is suitable for placement on the inside backside of the container and also for placement at the front wafer restraint. The length of lower leg of the V-shaped groove can be varied depending on the position of the V-shaped groove with respect to a wafer seated in the container. Such can accommodate sag during loading of the wafer and during the elevating of the wafer from a seating position without the door in place to a transport or door seated position. A downwardly extending upside down ledge may connect each lower leg upwardly extending surface to the adjacent upper leg downwardly extending surface.

In particular embodiments, the V-shaped grooves on the front wafer restraints that are attached to the inside of the door, can include a first attached or base portion generally non-movably secured to the door, a deflectable wafer engagement portion or enlarged pad that is the first portion to contact the wafer when the door is applied to the container, and an intermediate portion extending from the base portion to the deflectable wafer engagement portion. The horizontal V may preferably extend the entirely of length of the wafer restraint and has an aperture at the apex of the V-shaped groove on the intermediate portion defining fingers. Lower leg of the V-shaped groove in wafer engagement portion can extend farther than the lower leg of the V-shaped portion at the intermediate portion or at the base portion. In an aspect of the invention the wafer restraint has a base portion an intermediate dual finger portion and a wafer engagement pad portion and wherein the wafer engagement pad portion Swoops or is angled downwardly thereby providing an enhanced engagement surface for the wafer edge of sagging wafers. The dual fingers at the intermediate portion provide torsional stiffness while allowing flexibility in the z direction compared to a single finger with the same flexibility. In a preferred embodiment the lower leg of the expanded pad will first contact the wafer edge as the door is being closed and the wafer engagement point will ride up the pad and into the apex of the V-shape substantially the length of the wafer restraint.

In certain embodiments, the wafer shelves are formed by a stack of individual shelf sections that are identical with adjacent shelves. The top of the piece may be a mirror image of the bottom allowing the same mold of a single shelf piece to make the entirety of the shelves on the left side and the shelves on the right side. A series of apertures may allow for rods to extend through the stacked shelf pieces for alignment and structural stability as well as attachment to the structural framework.

In preferred embodiments each shelf has a forward most portion that follows the periphery of the wafer and extends inwardly from the laterally outermost edge of the wafer when seated a distance in the range of 50 to 60 mm. In another embodiment, it can extend 55 to 65 mm and in another embodiment, 52 to 56 mm. In certain embodiments where the wafer shelves on each side are molded unitarily, that is a plurality of shelves are molded as a single unit, a laterally inward recess is provided by an end portion extending rearwardly from a generally arcuate section that functions to maintain a maximum shelf width to facilitate injection molding. This allows appropriate draft on the mold inserts (and molded piece) forming the shelves to allowing the inserts to be removed during the molding process. In one embodiment, the recess is generally v-shaped. Thus in the plan view the front portion of the shelves has the shape of a checkmark providing easier molding.

In particular embodiments, the wafer shelf from the outer most seating position inwardly has a horizontal dimension, that is, width, of 14 to 18 mm in the rearward lateral portions of the shelves.

Hereto before it is believed that sag during engagement by a end effector, that is, a robotic hand that grasps a wafer for insertion and removal, was not recognized as presenting similar interference issues during insertion and retrieval as the sag problem presented by wafers seated in a wafer container. The sag of the wafer when seated on the end effector is at the lateral sides of the wafer, in the container portion, the sag of a wafer seated therein, without the door in place is at least at the front and may be at the front and rear depending on the wafer support arrangement at the rear of the container. Thus, optimizing the arcuate engagement regions of the end effector and the arcuate engagement regions of the container portion would be advantageous. Testing has surprisingly determined, that wafer support at arcs extending 90 degrees at only the lateral sides of a wafer provide essentially the same sag resistance as 270 degrees of wafer support with only the front open. Thus, utilizing this concept in both the end effector and wafer container will provide optimally minimal sag during both engagements, the engagement with the end effector when the wafers are inserted and removed, and the engagement with the wafer container, particularly when the door is not in place. Thus, the end effector will ideally grasp or engage the wafer at the front periphery and rear periphery at positions defining an arc that approaches 90 degrees. Similarly, the container will ideally support or engage the wafer contained therein, without the door on, at least approaching 90 degrees on each lateral side of the wafer. Clearances of between 2 mm and 10 mm are believed to be appropriate between the end effector's lateral margins and the wafer supports in the wafer container.

In a particular embodiment optimized to minimize sag both while the wafers are seated in the container portion and while the wafers are being transferred into or out of the wafer container, the wafer support provided by the container portion with the door removed and with the wafer seated in a position ready for robotic retrieval, the front opening will be approximately 90 degrees, plus or minus 8 degrees. In another embodiment, 90 degrees, plus or minus 5 degrees. In a particular embodiment the rear availability for engagement of the wafer in a wafer container by an end effector will correspond with the front availability for engagement with an end effector in said wafer container which will substantially match the angular access front opening. In an embodiment, the support provided, at the front of the wafer by the end effector will approach 90 degrees, for example about 84 to 88 degrees, the support provided at the rear peripheral edge of the wafer will approach 90 degrees, for example about 84 to 88 degrees, the right and left lateral support provided by combs or shelves of the wafer container will each approach 90 degrees, for example about 84 to 88 degrees, In a particular embodiment of a combination wafer container that provides peripheral wafer support and an end effector for insertion and removal of wafers from the wafer container, each of the lateral wafer supports of the wafer container will extend more than 80 degrees, the front access opening for receiving the end effector will be 85 to 100 degrees, the end effector will be configured for engaging the rear periphery of the wafer at positions defining an arc 80 to 95 degrees and for engaging the front periphery of the wafer at positions defining an arc of 80 to 95 degrees. The container will allow access of the rear periphery of the wafer by said end effector, that is the wafer periphery wilt be unsupported at the rear engagement positions of the end, effector.

In a particular embodiment of a combination wafer container that provides peripheral wafer support and an end effector for insertion and removal of wafers from the wafer container, each of the lateral wafer supports of the wafer container will extend more than 85 degrees, the front access opening for receiving the end effector will be 85 to 90 degrees, the end effector will be configured for engaging the rear periphery of the wafer at positions defining an arc 80 to 90 degrees and for engaging the front periphery of the wafer at positions defining an arc of 80 to 90 degrees. The container will allow access of the rear periphery of the wafer by said end effector, that is the wafer periphery will be unsupported at the rear engagement positions of the end effector.

In a particular embodiment of a wafer container, the arcuate range in degrees of available engagement of the rear periphery of a wafer in the wafer container by an end effector is within ten degrees of: the arcuate range in degrees of available engagement of the front periphery of a wafer; the arcuate continuous support of the lateral right periphery of the wafer in the wafer container, and the arcuate continuous support of the lateral left periphery of the wafer in the wafer container.

In an embodiment, the range of engagement of the end effector with the rear peripheral edge of a wafer being withdrawn from a wafer container will be at least 80 degrees. In a particular embodiment, the range of engagement of the end effector with the front peripheral edge of a wafer being withdrawn from a wafer container will be at least 80 degrees.

With the wafer seated, the most rearwardly point of the wafer periphery or edge is designated at zero degrees, the point of the wafer extending most laterally designated at 90 degrees, and the point of the wafer most forwardly designated at 180 degrees, the wafer shelf in a preferred embodiment extends along the wafer on the sides of the wafers to a forward position of 115 to 130 degrees. This provides a front access opening of 130 degrees to 100 degrees. In another embodiment a range of 115 to 140 degrees providing a front access opening for the end effector of 130 degrees to 80 degrees.

In particular embodiments, one or more deflectable wafer supports or wafer cushions also engage the wafers particularly when the wafers are in the second seating position. The wafer restraints are part of the internal framework structure and are not positionally controlled by the shell, including deflection, movement, or expansion of the shell.

In certain embodiments, enhanced peripheral bottom surface support is provided for the wafers that is believed to effectively eliminate excessive sag of large 450 mm wafers. In such a case the peripheral underside wafer support in the front opening container with the wafer seated on the wafer supports without the door in position effectively extends around in an exaggerated C-shape approximately to 240°, about 235° to 255° in certain embodiments, 235° to 265° in particular embodiments. In such embodiments, a second level of support when the door is in place may be provided by wafer restraints with V-shaped grooves, either or both of rigid, non deflectable, or deflectable. Deflectable infers at least a 1.5 mm motion capability in normal use. Such deflection will typically be primarily in a horizontal direction during normal use but may also have vertical components particularly when absorbing shock during transport.

The peripheral bottom surface support can be within 8 mm of the edge of the wafer in an embodiment, within 8 mm in another embodiment, and within 15 mm of the peripheral support in another embodiment, and within 25 mm of the exterior edge in another embodiment.

BRIEF DESCRIPTION OF THE DRAWINGS

FIG. 5 is a cut-away perspective view of a container portion in accord with aspects of the invention herein.

FIG. 6 is a schematic view showing the extent of underside wafer support in accord with aspects of the invention herein.

FIG. 7 is a detail cross-sectional exploded view showing an assembly arrangement for the kinematic coupling plate, the shell and internal framework in accord with aspects of the invention herein.

FIG. 13a is downward perspective view of a wafer shelf in accord with the invention herein. The perspective view upwardly is a mirror image.

FIG. 13b is an opposite side downward perspective view of the wafer shelf of FIG. 13a. The perspective view upwardly is a mirror image.

FIG. 14 is a schematic cross-sectional view of wafer container illustrating a V-shaped seating portion cross-section at a location directly facing the insertion direction of the wafer in accord with aspects of the invention herein.

FIG. 15 is a schematic cross-sectional view of wafer container illustrating a V-shaped seating portion cross-section at a location at the side of the wafer container in accord with aspects of the invention herein.

FIG. 16 is a partial cross-sectional view of a wafer container in accord with aspects of the invention herein.

DESCRIPTIONS OF PREFERRED EMBODIMENTS OF THE INVENTION

Figure 1:
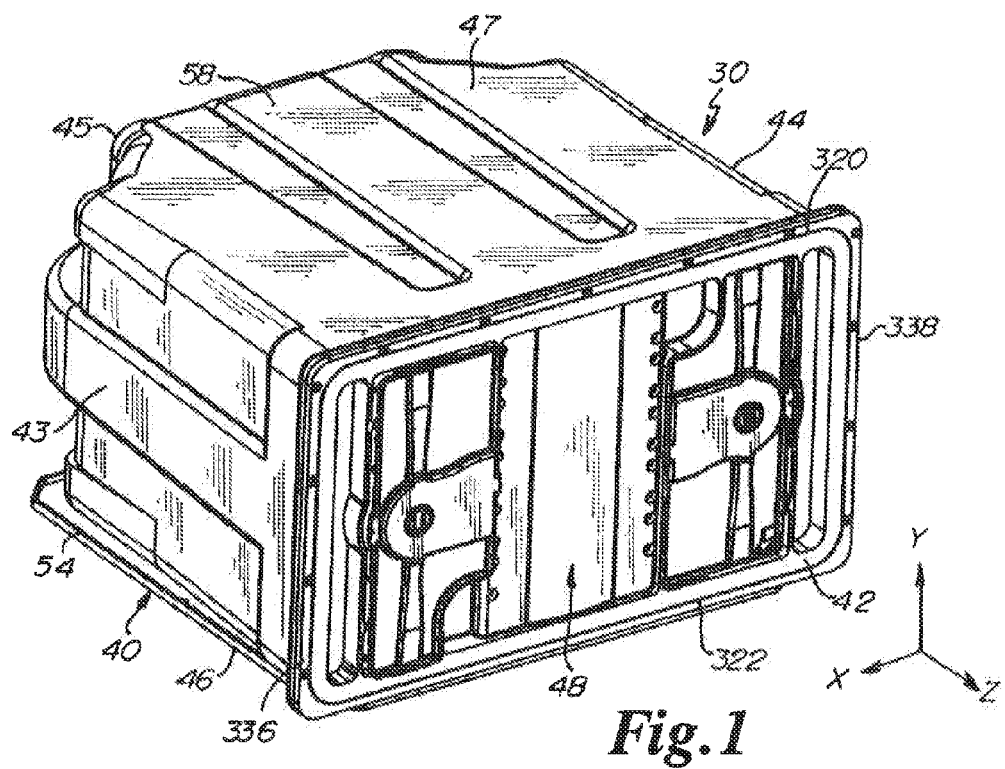
FIG. 1 is a perspective view of a 450 mm wafer container in accord with aspects of the invention herein.
Figure 2A:
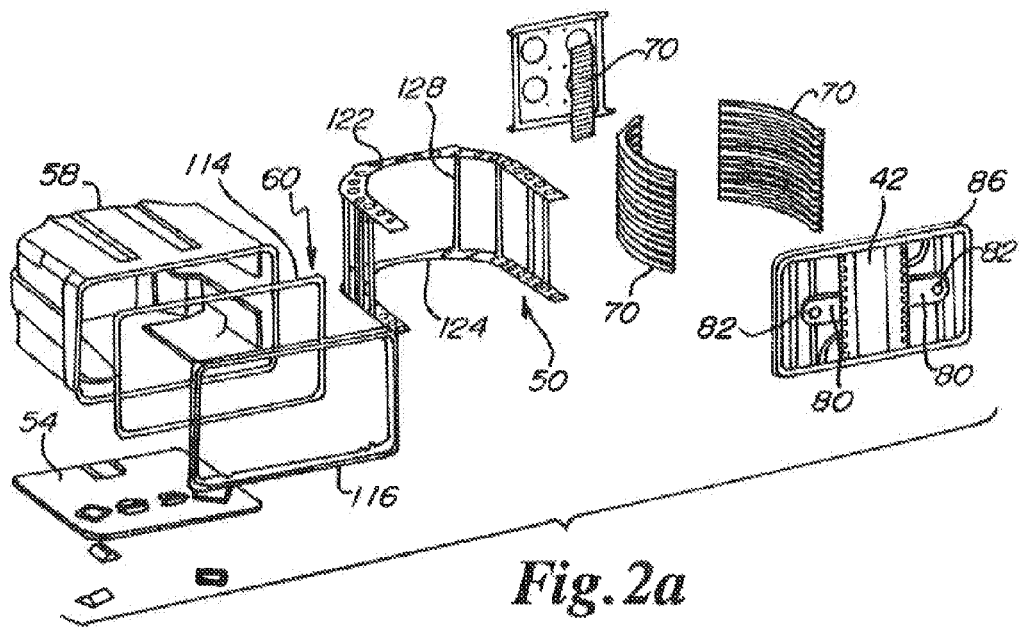
FIG. 2a is an exploded view of a wafer container in accord with aspects of the invention herein.
Figure 2B:
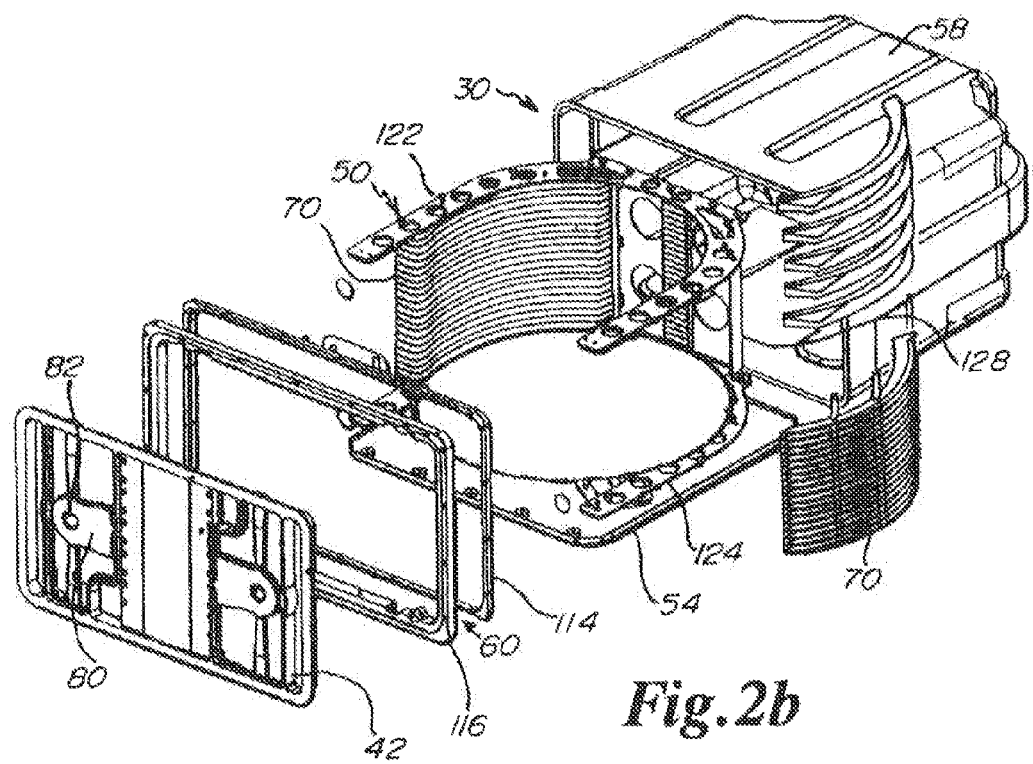
FIG. 2b is an exploded view of a wafer container in accord with aspects of the invention herein.
Figure 3:
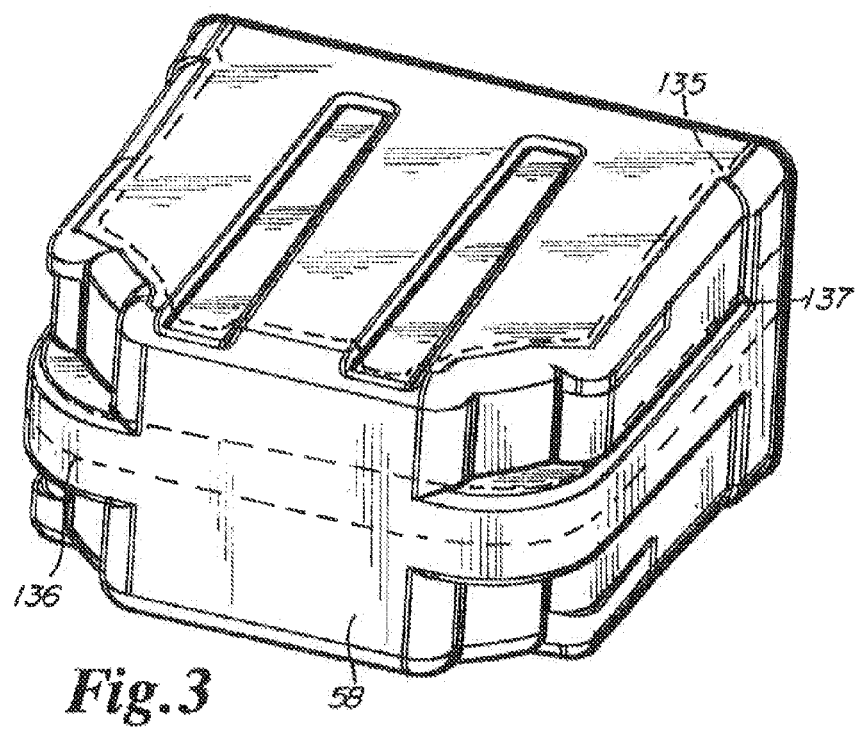
FIG. 3 is a rear perspective view of a shell for a wafer container in accord with aspects of the invention herein.

Referring to FIGS. 1-12b various views and embodiments of a wafer container 30 particularly suitable for large wafers, particularly 450 mm wafers, is illustrated. The wafer container generally comprises a container portion 40 and a door 42. The container portion generally has a closed left side 43, a closed, right side 44, a closed back 45, a bottom side 46, a top side 47, and an open interior 48. The container portion further comprises internal framework 50, a bottom machine interface plate 54, a shell 58, a door frame 60, and wafer shelves 70. A Substantially rectangular door frame 60 defines an open front. The door 42 comprises latch mechanisms 80 with keyholes 82 and latching tips 84, a periphery 86, and an inside surface 88 with a wafer restraint 90 thereon. The door latches are selectively engageable with the door frame 60 of the container portion 40 and seal by way of an elastomeric seal 94.

Referring to FIGS. 3, 4, 5, 7, 8, and 9, the shell 58 is preferably formed of a polymer such as polycarbonate and may be attached to the door frame by sandwiching the lip 110 within the two pieces 114, 116 of the door frame. A clamping may be effectuated by screws 118. Similarly, the shell may be sandwiched between the bottom machine interface 54 and the internal framework 50 and secured by screws 118. The door frame 60 may be attached to the machine interface 54 by such screws or other means. The internal framework 50 may be comprised of a U-shaped top frame member 122, a U-shaped bottom base frame portion 124 and a plurality of discrete attachment members 128 extending between the top frame member 122 and bottom base frame portion for rigidly securing the framework 50 together.

Figure 4:
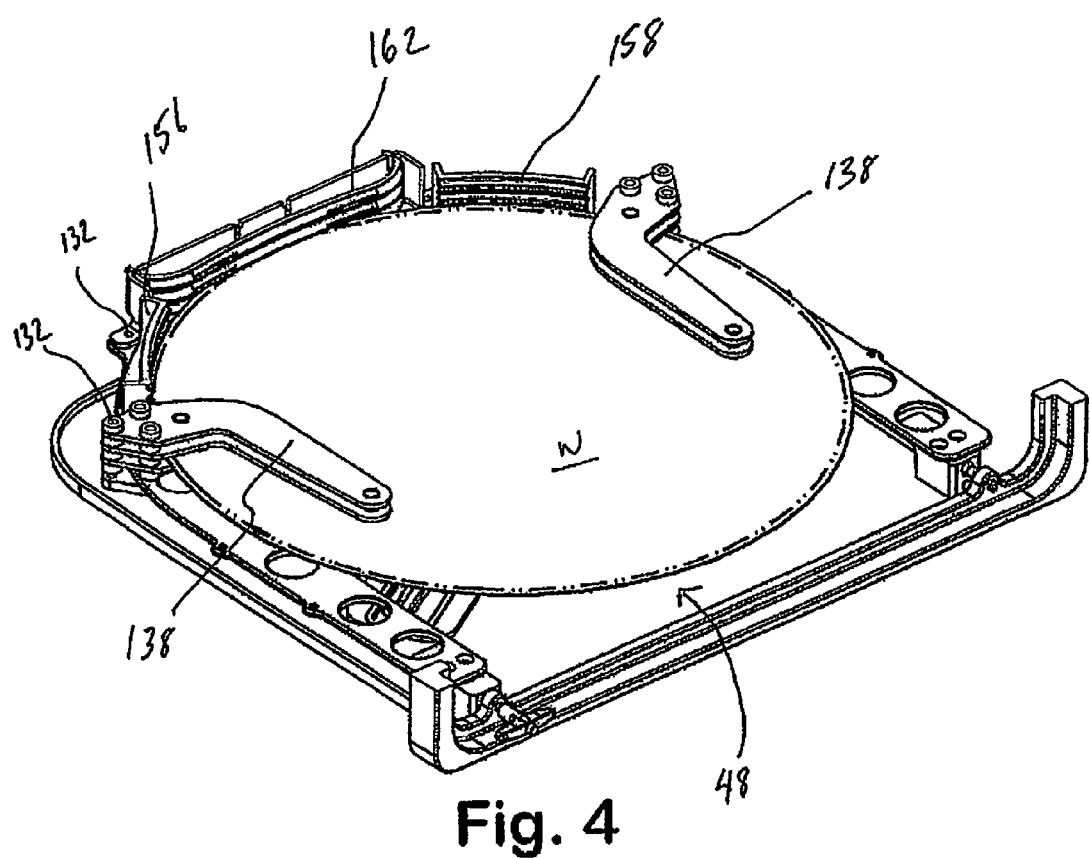
FIG. 4 is a cut-away perspective view of a container portion in accord with aspects of the invention herein.
Figure 9:
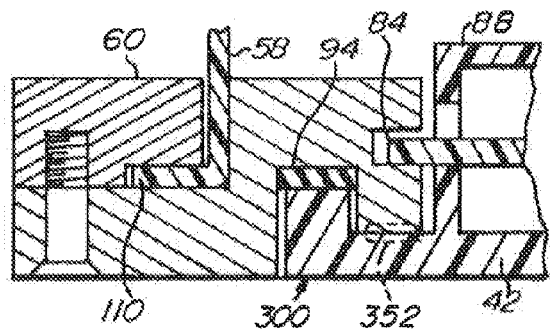
FIG. 9 is a cross-sectional assembled view of the component portions of FIG. 8 assembled and with the door engaged.
Figure 8:
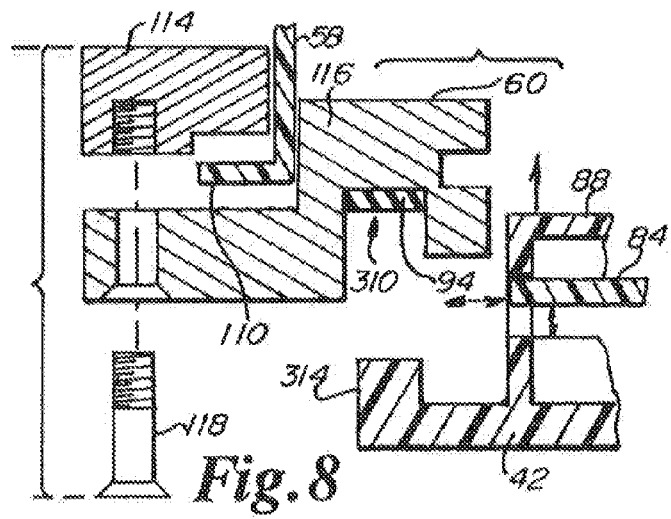
FIG. 8 is a detail exploded view of a shell, door frame, door arrangement in accord with aspects of the invention herein.

The wafer shelves, restraints, or combs 70 may be directly attached to the framework 50 by way of posts 132 integral with the restraints, see FIG. 4, or by other connection to the U-shaped pieces 122, 124, "Direct" attachment of two objects means the objects are held together in abutting relation by fasteners or other means. Door frame 60 may also be directly attached to the top from member 122 and/or the bottom base frame portion 124. Wafer combs 70 are not directly attached to shell 58, only to the framework 50. Therefore, deflection, movement, or expansion of the shell 58 does not directly apply any force to wafer combs 70 and therefore does not move or involve the wafers, so they will not be damaged. The posts 132 may have threaded bores to allow screws to extend through holes in the U-shaped pieces 122, 124 for assembly to the framework 50. In one embodiment, the framework 50, bottom machine interface plate 54, and door frame 60 may suitably be formed of aluminum. The shell may be vacuum molded or injection molded. It may be unitarily formed or may be formed in different pieces and assembled together. Potential demarcation lines 135, 136, and 137 for conveniently manufacturing separate shell pieces are dashed in FIG. 3.

Figure 10:
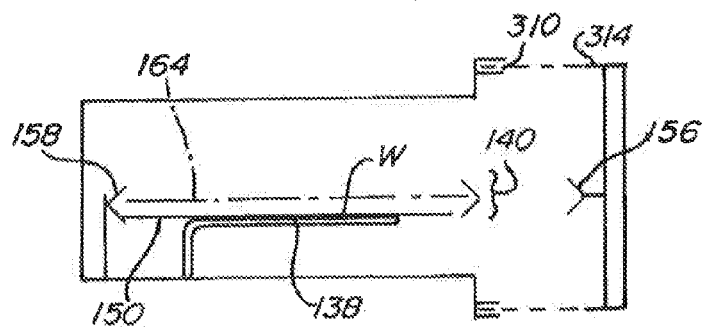
FIGS. 10 and 11 are schematic cross sectional views of wafer container illustrating the cantilever support member defining a first level of support and the forward and rearward wafer supports defining the second level.
Figure 11:
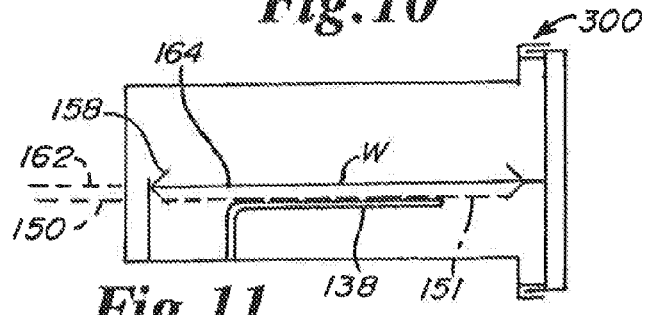

Referring to FIGS. 4, 10, and 11, an embodiment may utilize wafer supports comprising cantilevered forwardly extending supports 138 that are secured to the container portion at the back side of the container portion. The cantilever supports are illustrated as dogleg shaped and are suitably placed to appropriately control sag of the wafers at a position.

In certain embodiments, the positioning of the support provided by the forward extending cantilever support extends in at least 50 mm from the edge of the wafers. In other embodiments support extends at least 75 mm, 100 mm, or 125 mm from the peripheral edge of the wafers. The cantilever supports may have contact pads thereon at the contact points, not shown. The wafers may be inserted into the container at a slot 140 to rest on the cantilever supports defining a first level of support 150 and a seating position 151. At this level of support the wafer w may be exclusively supported by the cantilever supports or may be engaged for positioning at the peripheral edge of the wafer. When the door is inserted the wafer is elevated by forward and rearward V-shaped wafer restraints 156, 158 to be raised to a second level of wafer support 162 at a second seating position 164 where the cantilever wafer supports 138 are not supporting the wafer. Note the second seating position 164 is above and slightly rearward of the first seating position 151.

In the embodiment of FIG. 4, the wafer restraints comprise cantilever supports 138, rigid, non-deflectable V-shaped supports 158, and V-shaped cushions or deflectable restraints 162. The deflectable restraints 162 conform to follow the edge of the wafer upon insertion and engagement when the wafer is at the second seating position. Although a single wafer is illustrated in FIGS. 10 and 11, it should be understood that the entire vertically aligned array of wafers are moved and restrained as described.

Referring to FIG. 5, an alternative peripheral support arrangement is illustrated that provides peripheral support on the underside surface of the wafer w either at the lower corner or within preferably 7 mm of the corner, rather than support toward the middle of the wafer provided by the cantilever support described above. The wafer restraints illustrated in FIG. 5 include rigid, non-deflectable supports 170, 172 that extend past the forward-backward midpoint of the wafer, rigid non-deflectable supports 174, 176 that are positioned at the back side of the container portion, and deflectable wafer cushions 180, 182 positioned at the rear corners of the container portion. The first and second wafer seating positions illustrated by FIGS. 10 and 11 and described by the associated text, also apply to the FIG. 5 embodiment. Rather that the first seating position defined by supports off of the peripheral edge, that is, in the mid section of the bottom surface of the wafer, the first seating position is defined by the supports at the peripheral edge.

Referring to FIG. 6, it has been found that the peripheral support can prevent excessive sag of a 450 mm wafer w when the peripheral support extends around defining a support arc 194, of about 240 degrees of the wafer periphery. In some embodiments, support extends about 235° to 255° and in certain embodiments, 230° to 265°. In a another embodiment, the opening between supports is between 85 and 110 degrees. This precludes excessive sag and still allows maximum front side access to the wafers, such as be wafer end effectors for placement and removal of the wafers.

Referring to FIGS. 1, 4, 8, 9 and 10, the unique configuration comprising a interlaced door—door frame interface 300 is illustrated. The door frame 60 has an inwardly directed slot or groove 310 and the door has a projection or tongue 314 that enters the slot thereby constraining said projection within the slot to provide an interlacing of structural features. The door frame 60 has an upper horizontal portion 320 and a lower horizontal 322 portion where the slot or slots extend horizontally and are recessed inwardly with respect to the container portion and the corresponding projection or projections on the door also extend horizontally and project rearwardly. When engaged in said slot, the door 42 by way of the projections is constrained upwardly and downwardly. Similarly the door frame may have a left vertical portion 336 and a right vertical portion 338 where the slot or slots extend vertically and the corresponding projection or projections on the door also extend vertically and, when engaged in said slot or slots, the door is constrained to the left and to the right. The slot may be continuous or not continuous around the door frame and similarly the door may have a single cooperating projection extending around the entire periphery of the door or more than one projection at selected portions of the periphery of the door. In particular embodiments, the slot or groove will have an elastomeric seal 94 seated therein, in other embodiments, a seal may be positioned out of the slot or groove or on the door, see the region 352 of FIG. 9. Generally the seal will extend around the entirety of the door frame defining the door opening and engage with the entirety of the door periphery. The seal may also extend around the entirety of the door periphery and engage with the entirety of the door frame defining the door opening.

Figure 12A:
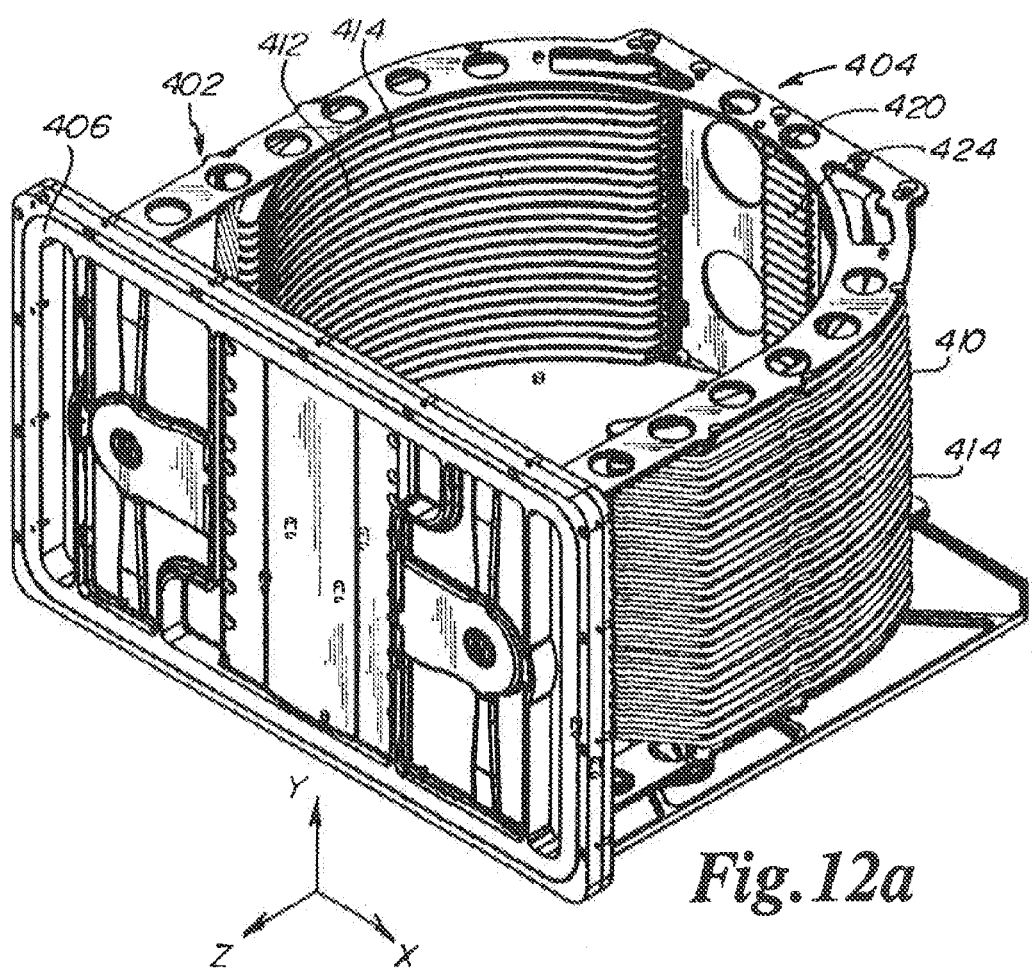
FIG. 12a is a perspective view of a 450 mm wafer container in accord with aspects of the invention herein.
Figure 12B:
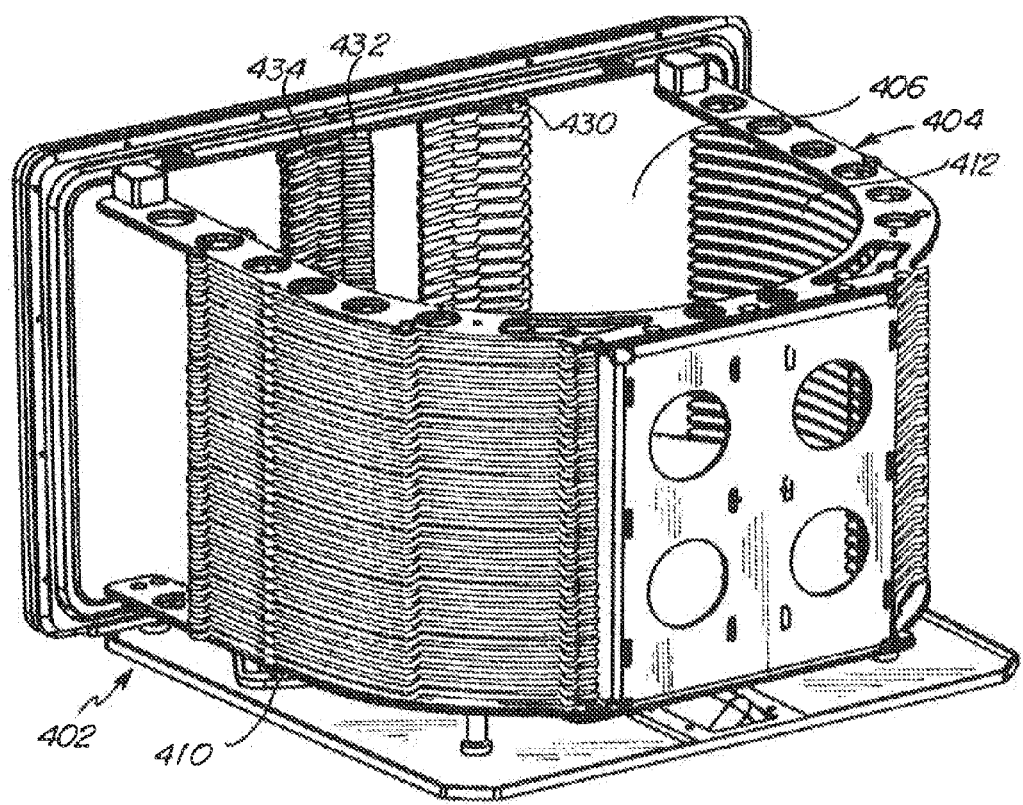
FIG. 12b is a perspective view of the container portion of the wafer container where the shell has been removed in accord with aspects of the invention herein.

FIGS. 12a and 12b provide an additional embodiment disclosing a wafer container 402 having a container portion 404 and a door 406 depicted with outer shell removed for the sake of clarity. The exploded views of FIGS. 2a and 2b relate to this embodiment. Within the container portion 404 are right and left side wafer shelves 410 and 412 defining a plurality of NT-shaped wafer slots 414, a back wafer restraint 420 with slots of V-shaped cross-section 424, and front wafer restraints 430 and 432 on the interior face of door 406 having a flexible arrangement and slots 434 of V-shaped cross-section. Together the V-shaped slots and the surrounding V-shaped portions of these components cooperate to position and secure wafers of various sizes for transport and storage. These and various other aspects of this container can be understood from FIGS. 14-20 as well. Detail of the shelves are shown in FIGS. 13a and 13b.

In some embodiments, an inventive aspect may include variation in the angle of the V of the V-shaped engagement portions depending on the positional placement of the V-shaped portions around the periphery of the wafer. In general, raising a wafer from a first shelf seating position (a wafer transfer position) to the second position (a transport position), (similar to movement from position 151 to position 164 shown in FIGS. 10 and 11) where the door 406 is put in place and latched, occurs by the wafers moving in the z direction with respect to the V-shaped seating portions. See FIG. 14 for an indication of the z direction with respect to the V-shaped slots on back and front wafer restraints 420, 430 and 432. Considering the larger 450 mm wafers, it is advantageous to have several V-shaped seating portions that the wafer can ride up to reach the seating position at the apex of the Vs.

Where the V-shaped seating portion is directly facing the insertion direction of the wafer (as on the back wafer restraint 420 for example), facing the z direction, the incline of the lower leg surface 510 is at the most gradual slope and the angle α between the upper leg (downwardly facing) surface 512 and the lower leg (upwardly facing) surface 510 is at a minimum. See the V-shaped support cross-section in FIG. 14, for example. Where V-shaped seating positions engage the wafer at a position where the seating portion is facing more towards the x-axis, that is, more towards the sides of the container than the back of the container (as somewhere on side wafer shelf 412), the slope of the lower leg surface 510 will be greater and the angle β defined by the lower leg surface 520 and the upper leg surface 522 will be greater. See the V-shaped support cross-section in FIG. 15, for example. The component of movement perpendicular to the V-shaped wafer portion is much less towards the sides of the wafer container than at the back of the wafer container, thus the greater angle on the wafer engagement portions towards the sides compared to the back side allows continual support at different peripheral locations on the wafer edge as the wafer is being elevated by the insertion of the door 406. This minimizes sag in the wafer. The V-shaped engagement portions may be isolated discrete portions extending a few millimeters horizontally to engage the wafer 5 to 20 mm in length, or can be much longer or even continuous on the backside of each slot. In certain embodiments the lower leg surface (upwardly facing) of the engagement portions can have a curvature and, similarly, the curvature of the lower legs of the wafer engagement portions positioned nearer the sides will be steeper than the curvature of engagement portion nearer the back side. The utilization of V-shaped engagement portions in elevating the wafer as the door is closed is disclosed in U.S. Pat. No. 6,267,245.

The unique structures of the V-shaped groove components have a number of advantageous features as well. In various embodiments, a wafer engaging surface 609 of lower leg 610 of the V-shaped groove may be longer than a wafer engaging surface 611 of the upper leg 612 such that lower leg of one wafer support extends beyond an extent of an upper leg of a wafer support immediately below. This configuration is advantageous as it provides a larger engagement region for larger wafers that may be sagging. Such an arrangement can be seen in FIG. 16. This V-shaped groove is suitable for placement on the inside backside of the container, as at back wafer restraint 420, and also for placement at and suitable for the front wafer restraints 430 and 432. Utilization of wafer supports having various types of this fail-safe cross section are contemplated as well. The length of lower leg 610 of the V-shaped groove can be varied depending on the position of the V-shaped groove with respect to a wafer seated in the container. This allows for accommodation of sag during loading of the wafer and during the elevating of the wafer from a seating position without the door 406 in place to a transport or door seated position. A horizontally extending inverted ledge portion 614 having a downwardly facing ledge surface 613 may connect each lower leg upwardly extending surface to the adjacent upper leg downwardly extending surface. This feature provides even greater security and retention for storing wafers in this design.

Figure 17:
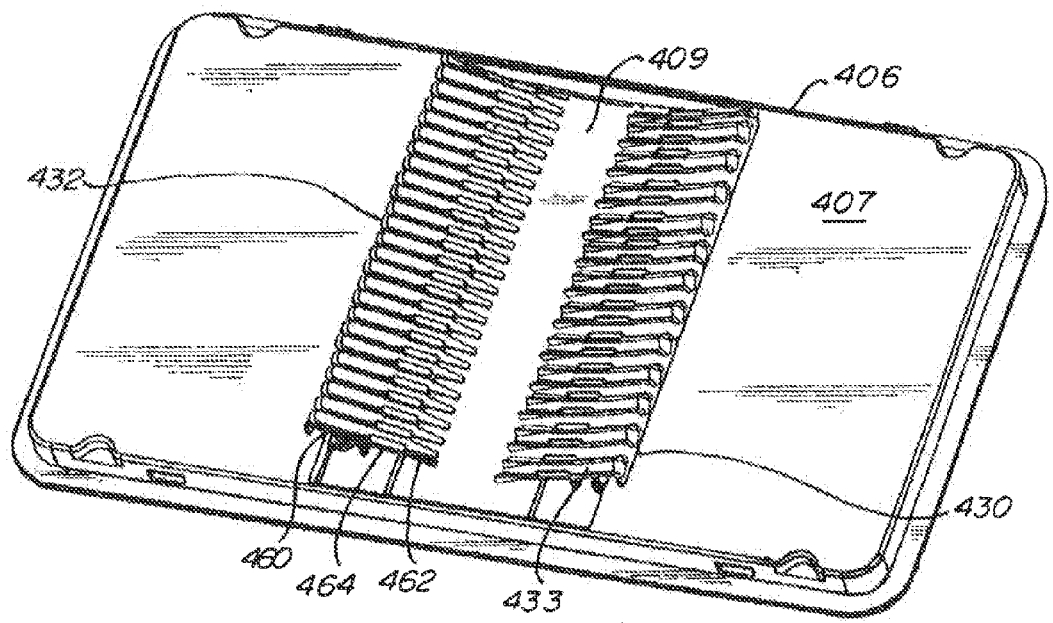
FIG. 17 is a perspective view showing the door of the wafer container where the interior face is shown in accord with aspects of the invention herein.
Figure 18:
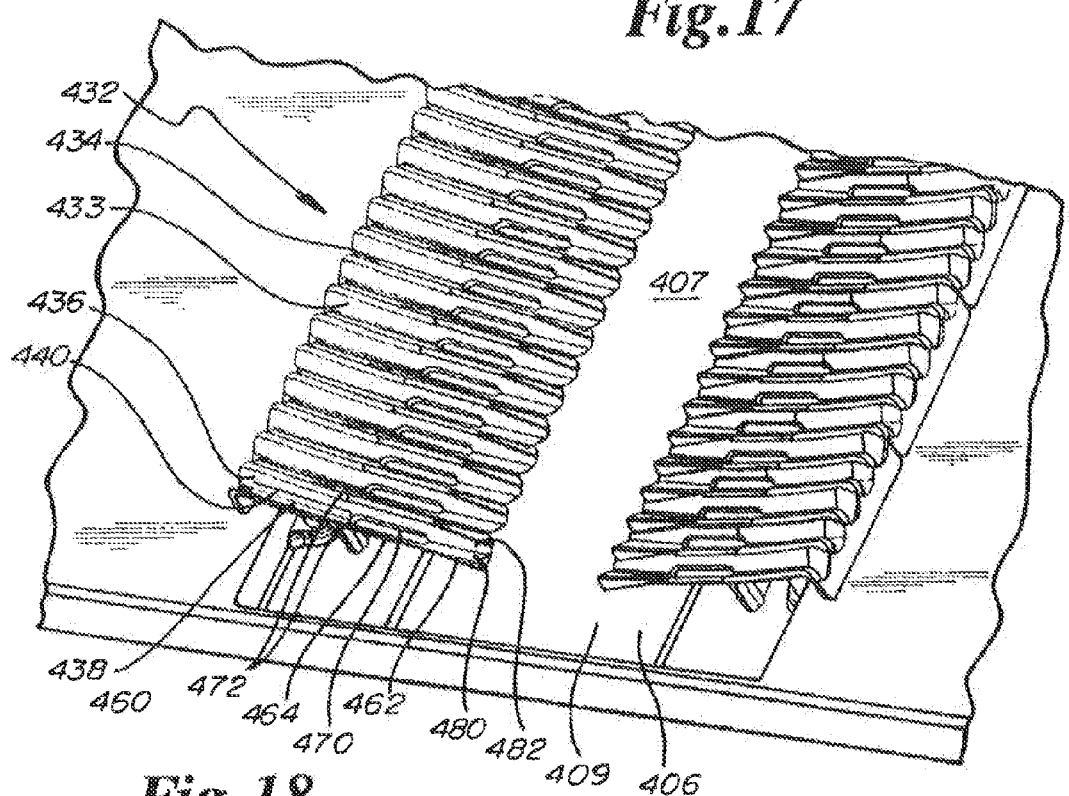
FIG. 18 is a partial close-up view of the front wafer constraints located on the interior of the door of the wafer container in accord with aspects of the invention herein.
Figure 19:
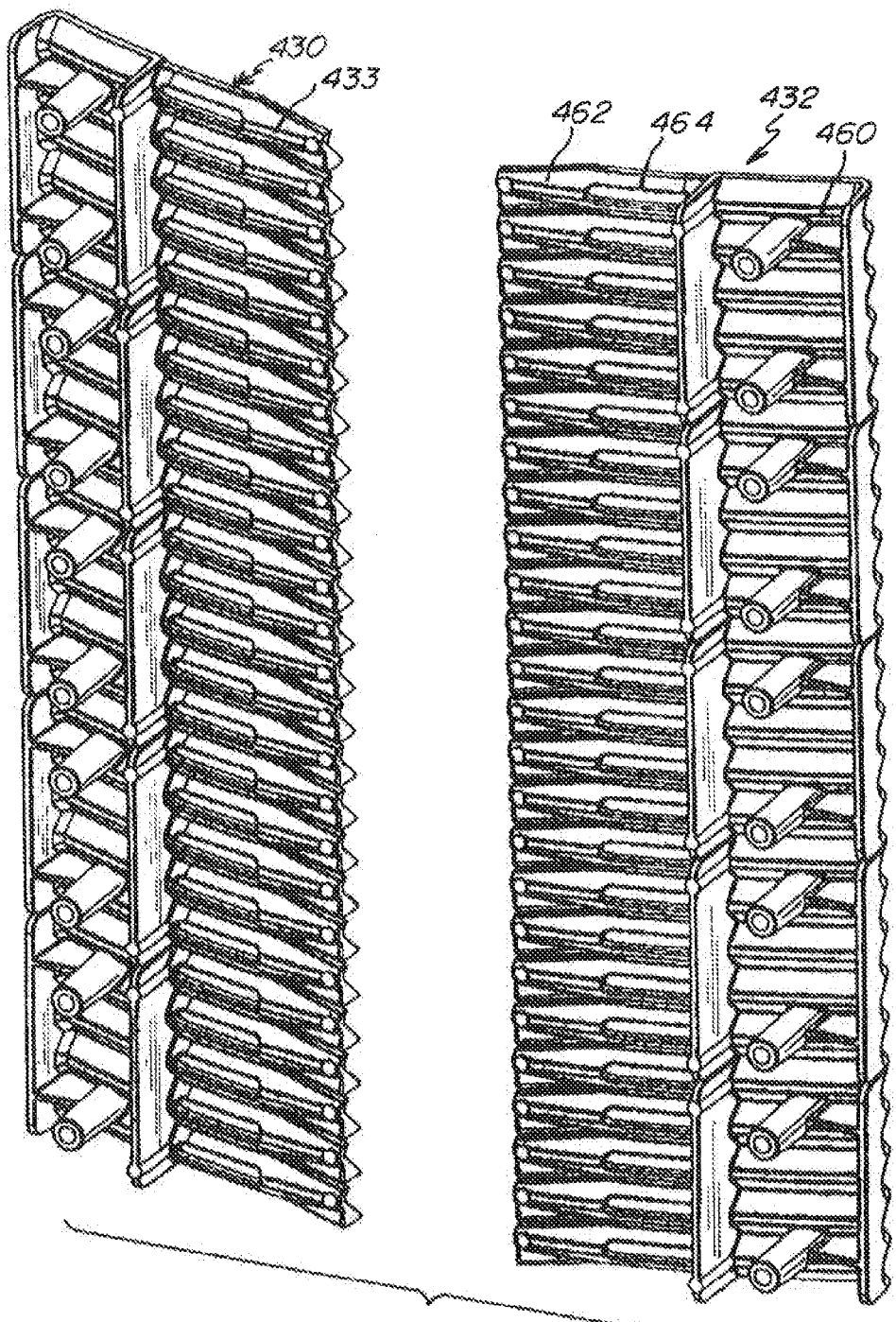
FIG. 19 is a perspective back side view of the wafer constraints of FIG. 18.

FIGS. 17-19 depict one embodiment of front wafer restraints 430, 432 according to the present invention. Wafer restraints 430, 432 are attached to an inside surface 407 of the door 406 and comprise a plurality of interconnected wafer supports 433 having V shaped grooves 434. V-shaped grooves 434 are defined by an upper leg 436 extending upwardly and outwardly from door 406 and a lower leg 438 extending downwardly and outwardly from door 406. An apex 440 of each V-shaped groove 434 is defined where upper legs 436 and lower legs 438 meet. Wafer restraints 430, 432 can angle inwardly into a recess 409 defined in door.

Wafer supports 433 also may have a first attached or base portion 460 generally non-movably secured to the door 406 and a deflectable wafer engagement portion 462 or enlarged pad that is the first portion to contact the wafer when the door is applied to the container. An intermediate portion 464 can connect the base portion 460 to the deflectable wafer engagement portion 462. Intermediate portion 464 can have an elongated aperture 470 at the apex of the V-shaped groove that defines fingers 472. The horizontal V may preferably extend the entirely of length of the wafer restraint 432. Lower leg 480 of wafer engagement portion 462 can be larger than upper leg 482 due to apex of V-shaped groove angling towards a top portion of upper leg from the aperture 470 to an end portion of the wafer engagement portion 462. Adjacent wafer supports 433 are interconnected at respective base portions 460 whereas adjacent intermediate portions and wafer engagement portions are not interconnected such that wafer engagement portion 462 and intermediate portion 464 are cantilevered from base portion 460.

Thus, in an aspect of the invention the wafer restraint has a base portion 460, an intermediate dual finger portion 464 and a wafer engagement pad portion 462 wherein the wafer engagement pad portion 462 swoops or is angled downwardly thereby providing an enhanced engagement surface for the wafer edge of sagging wafers. The dual fingers 472 at the intermediate portion 464 provide torsional stiffness while allowing flexibility in the z direction compared to a single finger with the same flexibility. In a preferred embodiment the lower leg 480 of the expanded pad will first contact the wafer edge as the door is being closed and deflect as the wafer engagement point rides up the pad and into the apex of the V-shape.

Figure 20:
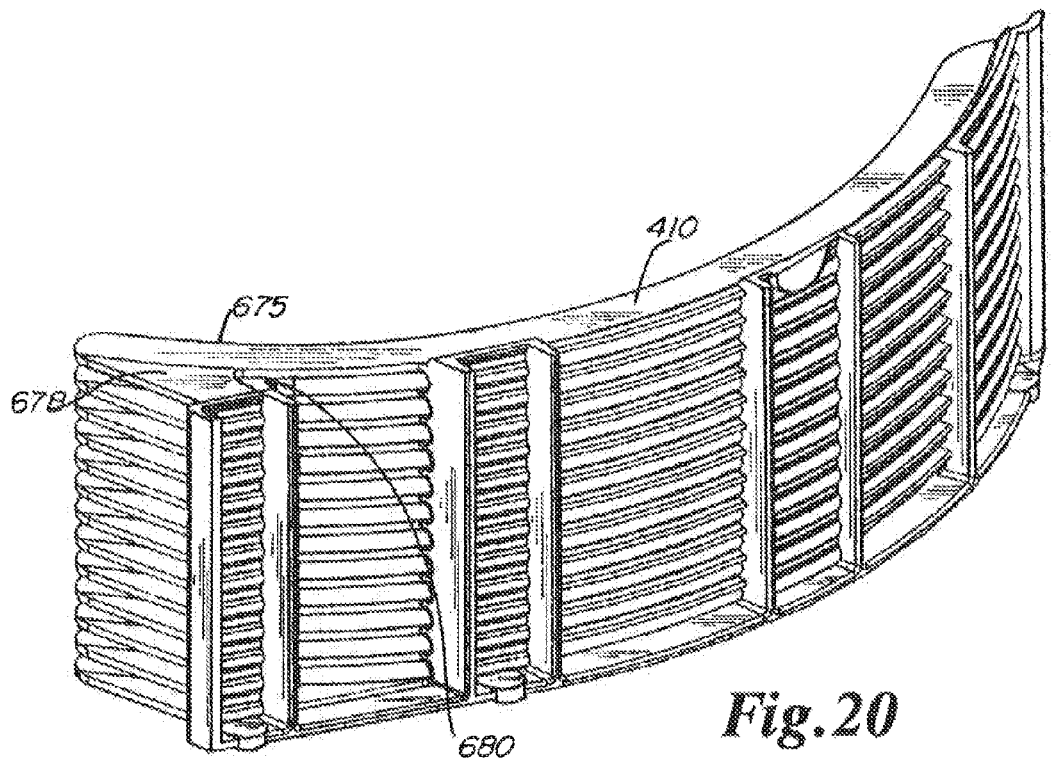
FIG. 20 is a cross-sectional view of a unitary molded wafer support in accord with aspects of the invention herein.

Referring in particular to FIGS. 13a and 13b, arcuate lateral wafer shelves 410 and 412 may simply be formed by a stack of individual shelf sections that are identical with adjacent shelves. Such an embodiment does not require formation of a single molded shelf section, which can be difficult to make due to the challenging manufacturing shape of such a molded component. The top of the piece may be a mirror image of the bottom allowing the same mold, of a single shelf piece to make the entirety of the shelves on the left side and the shelves on the right side. A series of apertures 483 may allow for rods to extend through the stacked shelf pieces for alignment and structural stability as well as attachment to the structural framework. The apertures 483 are typically located at multiple locations around the perimeter of the individual shelf sections. An arcuate engagement area 485 extends substantially the length of the component. Half of V-shaped support 487 is positioned on both sides of the component In preferred embodiments each shelf has a most forward end 675 that follows the periphery of the wafer and extends inwardly from the laterally outermost edge of the wafer when seated a distance in the range of 50 to 60 mm. In another embodiment the distance is 55 to 65 mm and in another embodiment it is 52 to 56 mm. In certain embodiments, as shown in FIG. 20, where the wafer shelves 410 and 412 on each side are molded unitarily, that is a plurality of shelves are molded as a single unit, a support leg 678 can extend at an acute angle from the forward end 675, thereby defining a laterally inward recess 680. Support leg 678 functions to maintain a maximum shelf width with minimal expanses of polymer to facilitate injection molding. This allows appropriate draft on the mold inserts (and molded piece) forming the shelves to allow the inserts to be removed during the molding process. Moreover, the decreased expanse of the polymer minimizes shrinkage and warpage issues. Thus in the plan view the front portion of the shelves has the shape of a checkmark.

In some preferred embodiments the wafer shelf from the outer most seating position inwardly typically has a horizontal dimension, that is, width, of 14 to 18 mm in the rearward lateral portions of the shelves. Also, once the wafer has seated, the general disposition of the wafer and container arrangement may be described. When the most rearwardly point of the wafer periphery or edge is designated at zero degrees, the point of the wafer extending most laterally designated is at 90 degrees, and the point of the wafer most forwardly designated is at 180 degrees. According to this disposition and reference framework, the wafer shelf in a preferred embodiment extends along the wafer on the sides of the wafers a range of 115 to 130 degrees, in another embodiment, a range of 115 to 140 degrees is used. Various other dispositions for Wafer shelves are possible as well.

Referring to FIGS. 21 to 24, a pair of jigs for testing the sag of 450 mm wafers are illustrated and also test results using such jigs. It is believed, that it has not been recognized that sag during engagement by an end effector presents comparable interference issues during insertion and retrieval as the sag problem presented by a wafer container. Indeed, with 300 mm handling this was not a significant problem. Testing has established significant sag when 450 mm wafers are handled by conventional end effectors and this sag can be eliminated by almost 50% whilst at the same time provided excellent sag prevention by the arcuate support in the wafer container.

Figure 21:
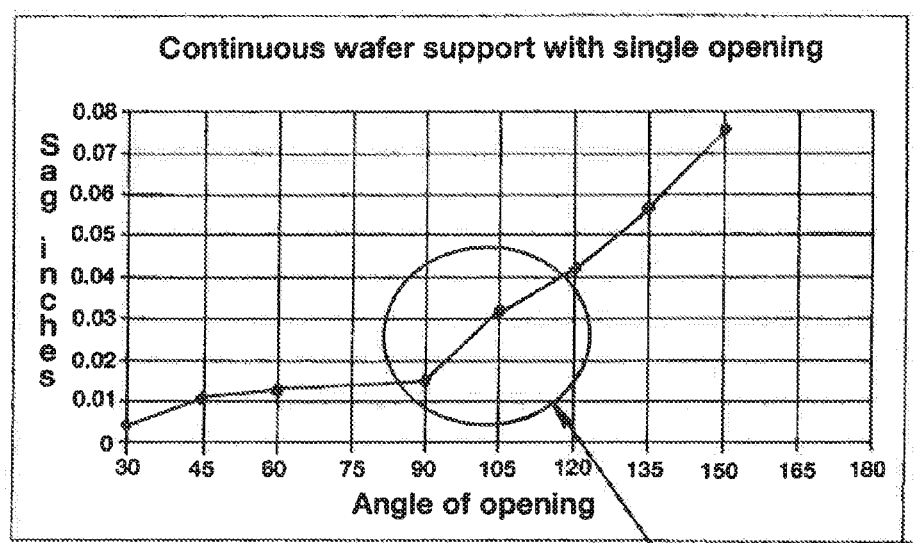
FIG. 21 is a graph displaying amount of wafer sag verses the angle of the opening for continuous wafer support with a single opening.
Figure 22:
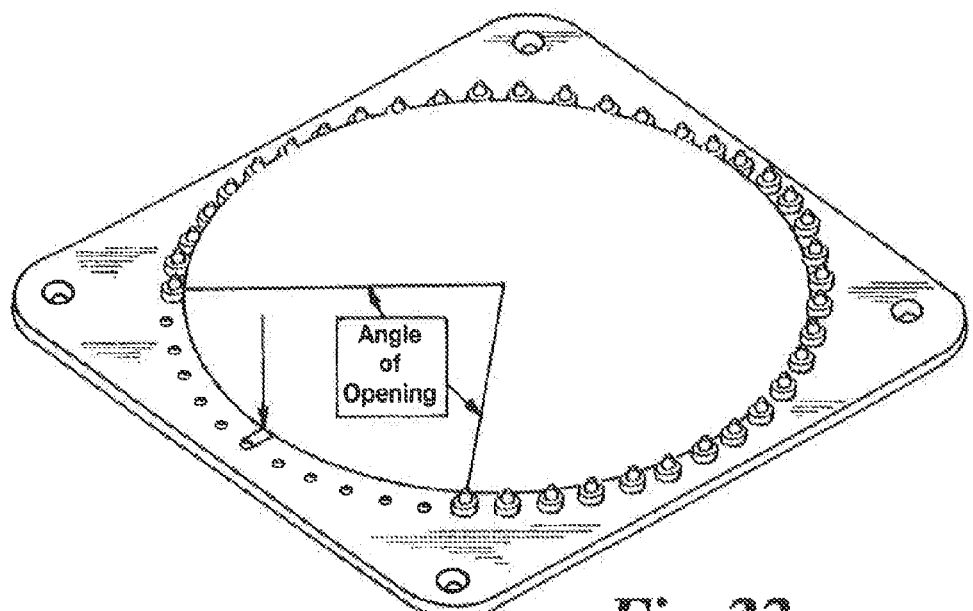
FIG. 22 is a perspective view of a jig utilized for collecting the data of FIG. 21.
Figure 23:
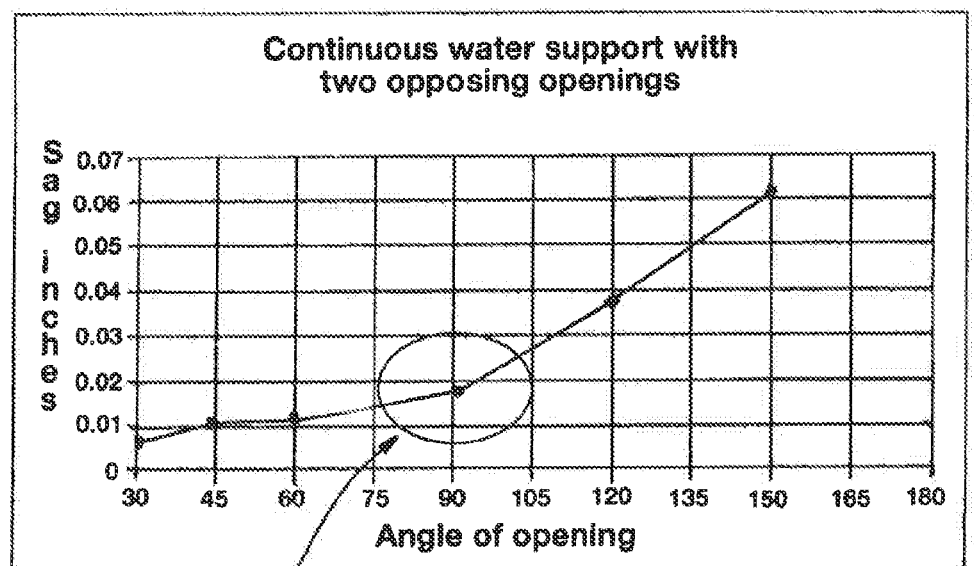
FIG. 23 is a graph displaying amount of wafer sag verses the angle of the opening for continuous wafer support with two opposed openings.
Figure 24:
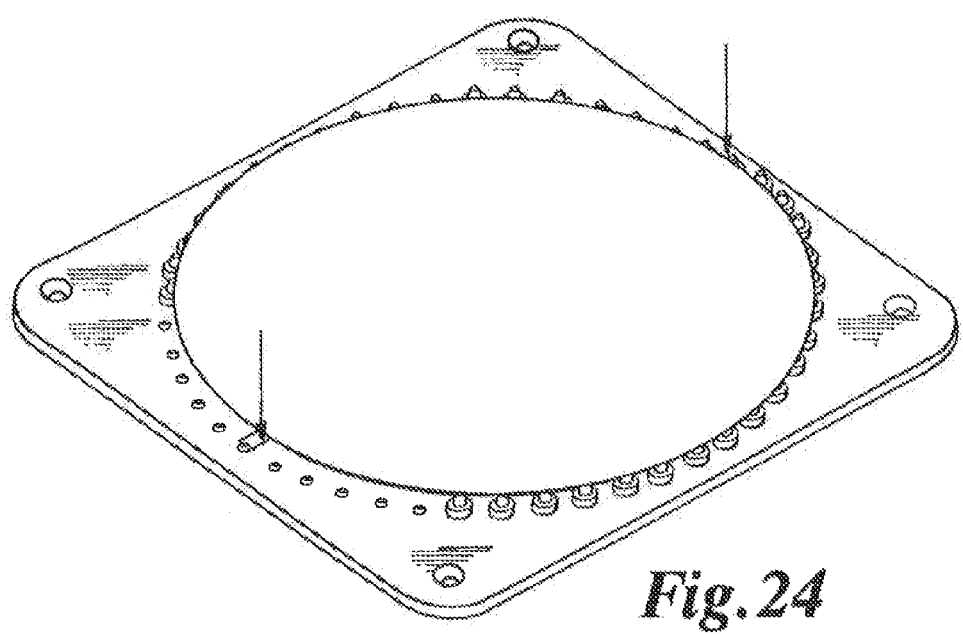
FIG. 24 is a perspective view of a jig utilized for collecting the data of FIG. 23.

The graph of FIG. 21 illustrates that with a continuous perimeter edge support and a single opening, a rapid increase 610 in the amount of wafer sag occurs as the opening increases beyond about 90 degrees. Thus, considering the difficulties in molding or otherwise fabricating teeth, a front opening of about 90 degrees is indicated to be close to optimum combination of molding and fabrication ease and benefit in sag prevention. FIGS. 23 and 24 presents the surprisingly results 611 that wafer support at arcs extending 90 degrees at only the lateral sides of a wafer provide essentially the same sag resistance as 270 degrees of wafer support with only the front open. Thus, the need for continuous or near continuous peripheral support around the entirety or near entirety at the rear of the wafer to get maximum sag prevention has been surprising disproved. Therefore, increasing the forward and rearward engagement arcs of an end effector and the necessary elimination in continuous or a reduced access area at the rear of the wafer results in an optimal combination of reducing sag during transfers by the end effector and while the wafer is seated.

Thus, optimally the end effector forward and rearward engagement arcs, the wafer container lateral engagement arcs will all approach 90 degrees, Necessary gaps for insertion and removal lower the maximum arcs to about 88 degrees. Thus, the end effector will ideally grasp or engage the wafer at the front periphery and rear periphery at positions defining an arc that approaches 90 degrees. Similarly, the container will ideally support or engage the wafer contained therein, without the door on, at least approaching 90 degrees on each lateral side of the wafer.

Figure 25:
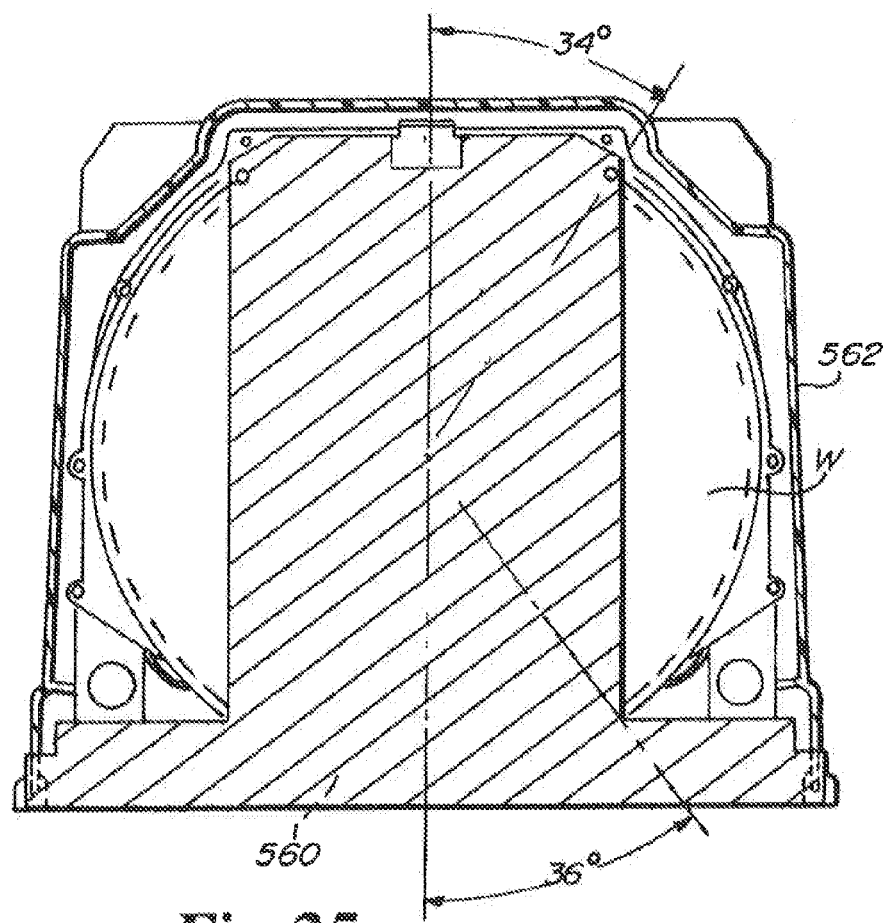
FIG. 25 is a view of an end effector and a wafer container portion described herein with clearance regions per pending SEMI standard 4570A
Figure 26:
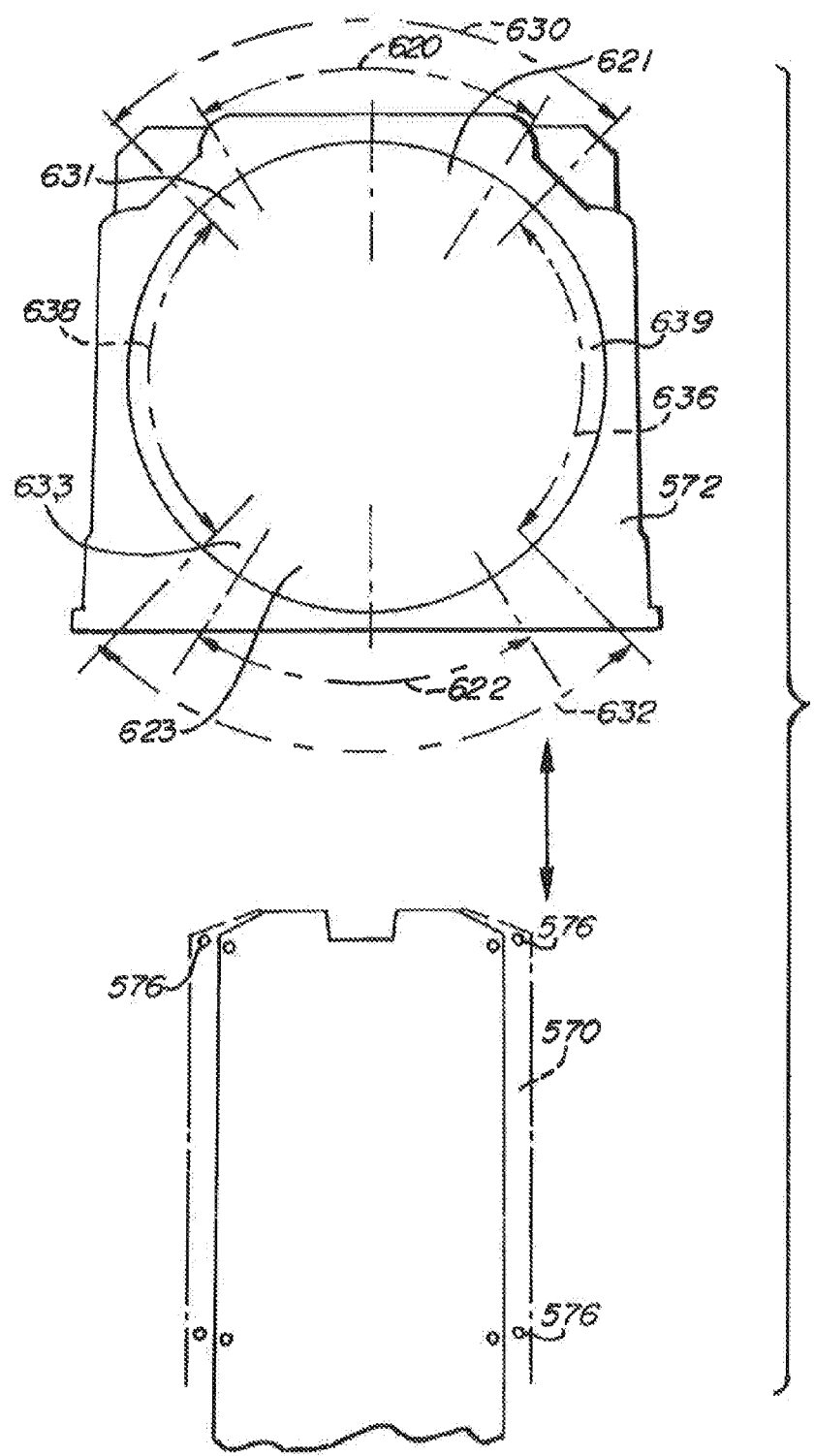
FIG. 26 is a view of an end effector and a wafer container portion with clearance regions per pending SEMI standard 4570A and engagement arcs according to the invention herein.

FIG. 25 illustrates a proposed industry maximum limit sized end effector 560 for engaging the 450 mm wafers W in a embodiment of a container portion 562 described herein. FIG. 26 illustrates a combination end effector with the increased size 570 indicated by the dashed lines in combination with a container portion 572. The engagement positions 576 engage the wafer and define the engagement arcs.

The proposed industry standards has a permissible maximum engagement arc 620 the periphery of the wafer of 68 degrees in the rear arcuate engagement area 621 of the wafer periphery and a maximum of 72 degrees in the front arcuate engagement area 622 for engaging the front arcuate engagement area of the wafer 623. The invention herein provides an increased end effector engagement arc 630 approaching 90 degrees in the rear arcuate engagement region 631 and a forward engagement arc 632 approaching 90 degrees in the front 633. Moreover the side engagement of the wafer is preferable at least approaching 90 degrees on the engagement arc 636 on the right lateral side and the engagement arc 638 on the right side for engaging the arcuate engagement areas 639 on the later periphery of the wafer. Notably the wafer container may have significant wafer support regions rearward of the end effector positions of engagement. That is the end effector contact with the wafer may simply be at two points that define an arc approaching 90 degrees. "Approaching" a specific number of degrees means herein with 10 degrees, that is approaching 90 degrees means 80 to 90 degrees. "About" when referencing a particular number of degrees herein means within 5 degrees.

"Connect" and "engage," when used herein does not require direct component to component physical contact unless explicitly stated but may include intermediate components that complete or contribute to the engagement or connection. The embodiments illustrated as holding a wafer and the inventive aspects illustrated therewith should also be interpreted as applying to other substrates such as flat panels.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered by the spirit and technical theory of the subject invention.

The invention claimed is:

1. A front opening semiconductor wafer container for receiving a plurality of large diameter circular wafers positioned in a stacked army with a vertical axis, the container comprising:
 a container portion having a left closed side, a right closed side, a closed back, an open front, and an open interior including a plurality of slots for receiving and containing the wafers centrally positioned within the open interior;
 a door attachable to the container portion to close the open front and selectively latchable to the container portion;
 the container portion comprising a pair of columns of interconnected wafer supports vertically aligned in the open interior, one of said pair proximate the left side and one proximate the right side, each of said pair having a radially inward margin with an arcuate shape to follow the circular shape of the wafers for providing peripheral support to the wafers, the arcuate shape of the radially inward margin of each of said pair of columns extending around to the open front side to a most inwardly and forward vertical stack of support tips whereby the opening between the respective vertical stacks of support tips measured with respect to the axis of the array of stacked wafers is between 85 to 110 degrees,
 wherein the interconnected wafer supports include a plurality of arcuate lateral wafer shelves that define a plurality of V-shaped wafer slots therebetween, the V-shaped wafer slots at least partially defining the plurality of slots, each of the plurality of slots defining a transport position wherein the respective wafer is seated at an apex of the respective V-shaped wafer slot.

2. The container of claim 1, wherein each of said pair of columns is a unitarily molded structure comprising an arcuate portion that follows the peripheral edges of the circular wafers, with a forward end, and further comprising a support leg extending from the forward end at an acute angle with respect, to the arcuate portion toward the respective side.

3. The front opening semiconductor wafer container of claim 1 wherein each of the interconnected wafer supports that extend more than 85 degrees around the periphery of the respective wafer engaged by the wafer support.

4. The front opening semiconductor wafer container of claim 1 in combination with an end effector configured for engaging the: rear periphery of the wafer at positions defining an arc 80 to 90 degrees and for engaging the front periphery of the wafer at positions defining an arc of 80 to 90 degrees.

5. The front opening semiconductor wafer container of claim 1, wherein the plurality of slots are further defined by a plurality of V-shaped supports, wherein the wafers are engaged in apexes of the V-shaped supports when in the transport position, and wherein each slot of the plurality of slots has a transfer position when the wafers are resting on the shelves, such that in the transfer position each wafer is supported on a pair of the lateral arcuate wafer shelves, one of said pair on each side of the wafer container, each of said shelves providing engagement of at least about 90 degrees on the periphery of the wafer and wherein the wafer container has an access opening defined intermediate the lateral arcuate wafer supports for receiving a robotic arm for conveying the wafers in and out of the wafer container and providing a robotic engagement access to the front edge of the wafer of 88 to 105 degrees, and wherein when the wafers are in said transfer position in said slots, the wafers are unsupported at least two positions in the rear of the wafer container portion, the two positions spread at least about 70 degrees around the periphery of the wafer.

6. The front opening semiconductor wafer container of claim 5, wherein each V-shaped wafer slot defines a first apex angle and each V-shaped support defines a second apex angle, the first apex angle being greater than the second apex angle.

7. The container of claim 1, wherein the opening between the respective vertical stack of support tips measured with respect to the axis of the array of stacked wafers is between 88 to 105 degrees.

8. A front opening semiconductor wafer container for large diameter 450 mm wafers, comprising:
a container portion having a left closed side, a right closed side, a closed back, an open front, and an open interior including a plurality of slots for receiving and containing the wafers;
a door attachable to the container portion to close the open front and selectively latchable to the container portion;
the container portion comprising a pair of columns of interconnected wafer supports vertically aligned in the open interior, one of said pair proximate the left side and one proximate the right side, each of said pair having a radially inward margin with an arcuate shape to follow the circular shape of the wafers for providing peripheral support to the wafers, the arcuate shape of the radially inward margin of each of said pair of columns extending around to the open front side to a most inwardly and forward vertical stack of support tips whereby the opening between the respective vertical stack of support tips measured with respect to the axis of the array of stacked wafers is between 85 to 110 degrees.

9. The from opening semiconductor wafer container for large diameter 450 mm wafers of claim 8, wherein the opening between the respective vertical stack of support tips measured with respect to the axis of the array of stacked wafers is between 88 to 105 degrees.

\* \* \* \* \*

UNITED STATES PATENT AND TRADEMARK OFFICE
CERTIFICATE OF CORRECTION

PATENT NO. : 8,919,563 B2  
APPLICATION NO. : 13/847345  
DATED : December 30, 2014  
INVENTOR(S) : Gregerson et al.

It is certified that error appears in the above-identified patent and that said Letters Patent is hereby corrected as shown below:

On Title Page, Column 1, item (51), under "Int. Cl.", delete " *H01L 21/673* (2006.01)  
*H01L 21/677* (2006.01) " and  
insert -- *H01L 21/673* (2006.01) --, therefor.

In the claims

In Column 17, Claim 2, Line 6, delete "The container of claim 1, wherein" and  
insert -- The front opening semiconductor wafer container of claim 1, wherein --, therefor.

In Column 17, Claim 3, Line 13, delete "claim 1 wherein" and insert -- claim 1, wherein --, therefor.

In Column 17, Claim 4, Line 18, delete "the : real" and insert -- the real --, therefor.

In Column 18, Claim 7, Line 8, delete "The container of claim 1, wherein" and  
insert -- The front opening semiconductor wafer container of claim 1, wherein --, therefor.

In Column 18, Claim 9, Line 33, delete "from" and insert -- front --, therefor.

Signed and Sealed this  
Seventeenth Day of November, 2015

Michelle K. Lee  
*Director of the United States Patent and Trademark Office*